United States Patent
Hino et al.

(10) Patent No.: US 12,183,774 B2
(45) Date of Patent: Dec. 31, 2024

(54) POWER CONVERTER

(71) Applicant: Mitsubishi Electric Corporation, Tokyo (JP)

(72) Inventors: Shiro Hino, Tokyo (JP); Junichi Nakashima, Tokyo (JP); Takaaki Tominaga, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 415 days.

(21) Appl. No.: 17/417,769

(22) PCT Filed: Feb. 22, 2019

(86) PCT No.: PCT/JP2019/006712
§ 371 (c)(1),
(2) Date: Jun. 24, 2021

(87) PCT Pub. No.: WO2020/170411
PCT Pub. Date: Aug. 27, 2020

(65) Prior Publication Data
US 2022/0013438 A1    Jan. 13, 2022

(51) Int. Cl.
*H01L 29/49* (2006.01)
*H01L 21/04* (2006.01)
(Continued)

(52) U.S. Cl.
CPC .......... *H01L 28/10* (2013.01); *H01L 21/0465* (2013.01); *H01L 21/7602* (2013.01);
(Continued)

(58) Field of Classification Search
CPC ............. H01L 29/0285; H01L 29/0288; H01L 29/0629; H01L 29/0692; H01L 29/0696;
(Continued)

(56) References Cited

U.S. PATENT DOCUMENTS 8,155,916 B2 * 4/2012 Baginski ............. H01L 29/4238
   702/133
8,816,410 B2 * 8/2014 Saito ................. H01L 29/42356
   257/288
(Continued)

FOREIGN PATENT DOCUMENTS

JP   62-290349 A   12/1987
JP   5-335487 A    12/1993
(Continued)

OTHER PUBLICATIONS

Office Action issued on Apr. 27, 2022, in corresponding German patent Application No. 11 2019 006 894.6, 17 pages.
(Continued)

*Primary Examiner* — Eduardo A Rodela
(74) *Attorney, Agent, or Firm* — XSENSUS LLP

(57) ABSTRACT

To provide a technique of reducing gate oscillation while suppressing reduction in switching speed. A semiconductor device according to the technique disclosed in the present description includes: a first gate electrode in an active region; a gate pad in a first region different from the active region in a plan view; and a first gate line electrically connecting the first gate electrode and the gate pad to each other. The first gate line is formed into a spiral shape. The first gate line is made of a different type of material from the first gate electrode.

16 Claims, 16 Drawing Sheets

(51) Int. Cl.
  *H01L 21/76* (2006.01)
  *H01L 21/761* (2006.01)
  *H01L 23/482* (2006.01)
  *H01L 29/06* (2006.01)
  *H01L 29/10* (2006.01)
  *H01L 29/16* (2006.01)
  *H01L 29/66* (2006.01)
  *H01L 29/78* (2006.01)
  *H01L 49/02* (2006.01)
  *H02M 7/00* (2006.01)

(52) U.S. Cl.
  CPC ........ *H01L 21/761* (2013.01); *H01L 23/4824* (2013.01); *H01L 29/0623* (2013.01); *H01L 29/1095* (2013.01); *H01L 29/1608* (2013.01); *H01L 29/49* (2013.01); *H01L 29/66068* (2013.01); *H01L 29/7811* (2013.01); *H02M 7/003* (2013.01)

(58) Field of Classification Search
  CPC ........... H01L 29/1033; H01L 29/66325; H01L 29/66333; H01L 29/66666; H01L 29/66674; H01L 29/66712; H01L 29/7393; H01L 29/7395; H01L 23/4824; H01L 28/10; H01L 29/49; H02M 7/003
  See application file for complete search history.

(56) References Cited

U.S. PATENT DOCUMENTS 9,570,553 B2 * 2/2017 Noebauer ........... H01L 29/7813
10,483,383 B2 * 11/2019 Weyers .............. H01L 29/0696
10,566,324 B2 * 2/2020 Losee ................... H01L 23/647
11,043,557 B2 * 6/2021 Hoshi ................... H01L 29/435
2016/0260705 A1   9/2016 Ikimura
2016/0380047 A1  12/2016 Hara et al.
2017/0287828 A1  10/2017 Sawada
2020/0185517 A1   6/2020 Nakao et al.

FOREIGN PATENT DOCUMENTS

| JP | 6-61058 A | 3/1994 |
| JP | 7-153912 A | 6/1995 |
| JP | 2003-152183 A | 5/2003 |
| JP | 2005-129826 A | 5/2005 |
| JP | 4138192 B2 | 8/2008 |
| JP | 2010-182985 A | 8/2010 |
| JP | 2016-82039 A | 5/2016 |
| JP | 2016-162910 A | 9/2016 |
| JP | 2017-17078 A | 1/2017 |
| JP | 2017-76803 A | 4/2017 |

OTHER PUBLICATIONS

International Search Report and Written Opinion mailed on May 14, 2019, received for PCT Application PCT/JP2019/006712, Filed on Feb. 22, 2019, 8 pages including English Translation.
Office Action issued Dec. 22, 2023 in Chinese Patent Application No. 201980091762.8, 17 pages.

* cited by examiner

F I G. 1 8
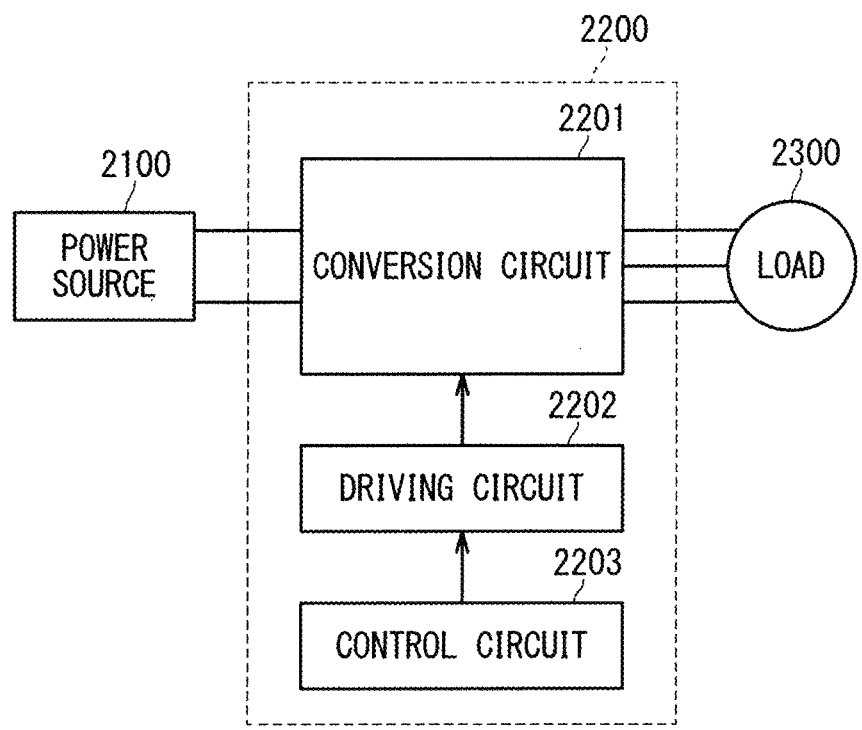

POWER CONVERTER

CROSS-REFERENCE TO RELATED APPLICATION

The present application is based on PCT filing PCT/JP2019/006712, filed Feb. 22, 2019, the entire contents of which are incorporated herein by reference.

TECHNICAL FIELD

A technique disclosed in the present description relates to a semiconductor device and a power converter.

BACKGROUND ART

An insulated power semiconductor module used in a power converter such as an inverter or a converter employs a technique of mounting a plurality of semiconductor switching elements in one module and causing the semiconductor switching elements to operate in parallel in order to respond to a large current.

In such a configuration, however, even if the semiconductor switching elements to operate in parallel have characteristics equal to each other, non-uniformity of lines in the module may be caused, and this may cause non-uniformity of switching characteristics occurring when the semiconductor elements operate in parallel.

Increase in the number of the semiconductor switching elements to operate in parallel causes increase in an area of arrangement of the elements or complication of lines, for example, resulting in increase in parasitic inductance between the semiconductor switching elements to operate in parallel.

As a result of the non-uniformity of switching characteristics between the semiconductor switching elements to operate in parallel and the increase in parasitic inductance between the semiconductor switching elements described above, a phenomenon of what is called "gate oscillation" may be caused in which a voltage and a current at the semiconductor switching element oscillate, which is accompanied by positive feedback amplification caused by potential oscillation at a control electrode (gate electrode) resulting from the parasitic capacitances of the semiconductor switching elements and the parasitic inductance between the semiconductor switching elements.

The gate oscillation becomes a cause for deterioration or breakdown of the semiconductor switching element, and additionally, may become a cause for radiation noise directed toward the outside of the module or conduction noise directed toward an external circuit, for example.

To suppress such gate oscillation, a configuration of connecting a resistance element in series to a gate line in a semiconductor element is described in patent document 1 (Japanese Patent Application Laid-Open No. 2005-129826), for example.

As another example, a configuration of connecting a high-frequency loss element in series to a gate line is described in patent document 2 (Japanese Patent Publication No. 4138192).

PRIOR ART DOCUMENTS

Patent Documents

Patent Document 1: Japanese Patent Application Laid-Open No. 2005-129826
Patent Document 2: Japanese Patent Publication No. 4138192

SUMMARY

Problem to be Solved by the Invention

The techniques disclosed in patent document 1 and patent document 2 are intended to suppress the gate oscillation by causing the semiconductor switching element to make switching operation (on/off operation) gently.

In the cases disclosed in patent document 1 and patent document 2, however, only a gate resistance is used for reducing the gate oscillation. This makes a tradeoff between the gate resistance and the gate oscillation. Specifically, the gate oscillation is reduced by applying a large gate resistance. However, this reduces a switching speed to cause a problem of increasing power loss.

The technique disclosed in the present description has been developed in view of the foregoing problem, and the present description is intended to provide a technique of reducing gate oscillation while suppressing reduction in switching speed.

Means to Solve the Problem

A first aspect of the technique disclosed in the present description includes: a first gate electrode in an active region; a gate pad in a first region different from the active region in a plan view; and a first gate line electrically connecting the first gate electrode and the gate pad to each other. The first gate line is formed into a spiral shape. The first gate line is made of a different type of material from the first gate electrode.

A second aspect of the technique disclosed in the present description includes: a first gate electrode in an active region; a gate pad in a first region different from the active region in a plan view; and a first gate line electrically connecting the first gate electrode and the gate pad to each other. The first gate line is formed into a spiral shape. The first gate line is arranged in the first region.

A third aspect of the technique disclosed in the present description includes: a first gate electrode in an active region; a gate pad in a first region different from the active region in a plan view; and a first gate line electrically connecting the first gate electrode and the gate pad to each other. The first gate line surrounds the active region in a plan view and is not closed.

A fourth aspect of the technique disclosed in the present description includes a plurality of the semiconductor devices according to any of the aspects described above. The semiconductor devices are connected in parallel to each other.

Effects of the Invention

The first aspect of the technique disclosed in the present description includes: a first gate electrode in an active region; a gate pad in a first region different from the active region in a plan view; and a first gate line electrically connecting the first gate electrode and the gate pad to each other. The first gate line is formed into a spiral shape. The first gate line is made of a different type of material from the first gate electrode. In this configuration, a tradeoff between improvement in switching speed and reduction in gain relative to high-frequency oscillation is alleviated using an inductance component resulting from the first gate line. This makes it possible to reduce gate oscillation while suppressing reduction in switching speed.

The second aspect of the technique disclosed in the present description includes: a first gate electrode in an active region; a gate pad in a first region different from the active region in a plan view; and a first gate line electrically connecting the first gate electrode and the gate pad to each other. The first gate line is formed into a spiral shape. The first gate line is arranged in the first region. In this configuration, a tradeoff between improvement in switching speed and reduction in gain relative to high-frequency oscillation is alleviated using an inductance component resulting from the first gate line. This makes it possible to reduce gate oscillation while suppressing reduction in switching speed.

The third aspect of the technique disclosed in the present description includes: a first gate electrode in an active region; a gate pad in a first region different from the active region in a plan view; and a first gate line electrically connecting the first gate electrode and the gate pad to each other. The first gate line surrounds the active region in a plan view and is not closed. In this configuration, a buried gate inductance resulting from a spiral coil can be formed between the gate pad and the first gate electrode in the active region to alleviate a tradeoff between improvement in switching speed and reduction in gain relative to high-frequency oscillation. This makes it possible to reduce gate oscillation while suppressing reduction in switching speed.

The fourth aspect of the technique disclosed in the present description includes a plurality of the semiconductor devices according to any of the aspects described above. The semiconductor devices are connected in parallel to each other. In this configuration, in the power converter in which a plurality of the semiconductor devices is connected in parallel and is to operate in parallel, an inductance component is applied to the gate line of each of the semiconductor devices. This makes it possible to alleviate or suppress gate oscillation while causing no increase in power loss.

These and other objects, features, aspects, and advantages of the technique disclosed in the present description will become more apparent from the following detailed description when taken in conjunction with the accompanying drawings.

BRIEF DESCRIPTION OF DRAWINGS

FIG. 18 conceptually shows an example of the configuration of a power conversion system including a power converter according to the embodiment.

DESCRIPTION OF EMBODIMENT(S)

Figure 1:
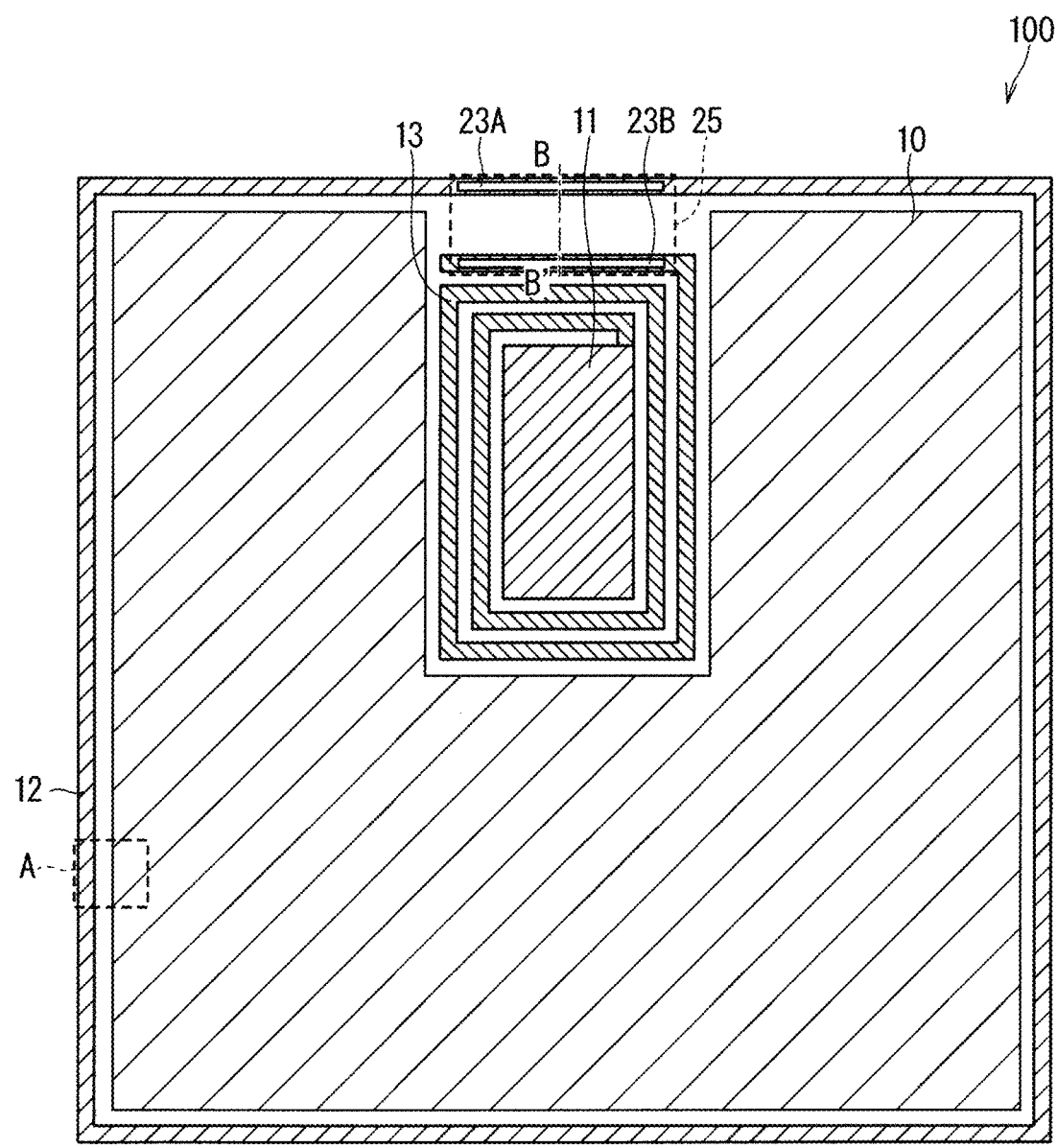
FIG. 1 is a plan view schematically showing an example of the configuration of a silicon carbide semiconductor device according to an embodiment.

Embodiments will be described below by referring to the accompanying drawings. In the embodiments described below, while detailed features, etc. are shown for describing a technique, these features are given as examples and all of these features are not features essential for making the embodiments feasible. Exemplary effects achieved by corresponding embodiments will be shown together after description of all the embodiments.

The drawings are shown as schematic drawings. For the convenience of description, a structure may be omitted or simplified in the drawings, if appropriate. The sizes and positions of structures in different drawings relative to each other are not always illustrated correctly but can be changed, if appropriate. In a drawing such as a plan view not illustrated as a sectional view, hatching may also be added for facilitating understanding of the substances of the embodiments.

Similar constituting elements in the following description are given the same sign in the drawings, and these constituting elements are given the same name and are intended to fulfill the same function. Thus, in some cases, the detailed descriptions of these elements will be omitted for avoiding an overlap.

In the following description, terms indicating particular positions and directions such as "upper," "lower," "left," "right," "side," "bottom," "front," and "back" may be used.

These terms are used for the sake of convenience for facilitating understanding of the substances of the embodiments and do not relate to directions during actual implementations.

In the following description, the term "the upper surface of . . . " or "the lower surface of . . . " means the upper surface itself of a mentioned constituting element, and additionally, covers a state in which another constituting element is formed on the upper surface of the mentioned constituting element. As a specific example, the term "B provided on the upper surface of A" does not exclude the presence of another constituting element "C" between A and B.

In the following description, an ordinal number "first" or "second" may be used. These terms are used for the sake of convenience for facilitating understanding of the substances of the embodiments, and these ordinal numbers are not intended to impose a limitation on order that might be defined by these numbers.

The term "MOS" mentioned herein was formerly used for indicating a stack structure of metal, an oxide, and semiconductor, and is said to be a term defined by taking the initials of Metal, Oxide, and Semiconductor.

Referring particularly to a field-effect transistor having a MOS structure hereinafter may simply be called a "MOS transistor"), however, improvements have been made to materials of a gate insulating film and a gate electrode in terms of improvements in integration and manufacturing process of recent years, etc.

In the MOS transistor, for example, in terms of mainly forming a source and a drain in a self-aligned manner, polycrystalline silicon has been used instead of metal as a material of the gate electrode.

A material of a high dielectric constant is used as a material of the gate insulating film in terms of improving electrical characteristics. However, this material is not always limited to an oxide.

For the reason given above, the term "MOS" is not always limited only to a term used only for indicating a stack structure of metal, an oxide, and semiconductor, and such limitation does not form a basis of the present description.

Namely, in view of technical common knowledge, the term "MOS" mentioned herein is not used only as an abbreviation resulting from its origin but has a meaning widely covering a stack structure of a conductor, an insulator, and semiconductor.

In the following description, regarding conductivity types of impurity, an n-type is generally defined as a "first conductivity type" and a p-type is generally defined as a "second conductivity type." However, these impurity types may be defined in a reversed way.

In the following description, the expression "A and B being electrically connected to each other" means that a current can flow bi-directionally between the structure A and the structure B.

First Embodiment

A semiconductor device and a method of manufacturing the semiconductor device according to a first embodiment will be described below.
<Configuration of Semiconductor Device>

FIG. 1 is a plan view schematically showing an example of the configuration of a silicon carbide semiconductor device according to the first embodiment. The silicon carbide semiconductor device shown in FIG. 1 is a semiconductor switching element, which is more specifically a field-effect transistor with a MOS structure formed on the upper surface of an SiC substrate (a silicon carbide metal-oxide-semiconductor field-effect transistor, namely, a MOSFET 100).

In the following, while the silicon carbide MOSFET 100 is described as a device of a planar gate type, the silicon carbide MOSFET to which the present technique is applicable is not limited to a planar gate type.

While silicon carbide (SiC) is described as semiconductor used in the semiconductor device, semiconductor to which the present technique is applicable is not limited to silicon carbide (SiC) but the present technique is also applicable to an Si semiconductor device made of silicon (Si), or to a wide bandgap semiconductor device made of wide bandgap semiconductor such as gallium nitride (GaN) or diamond (C), for example.

The silicon carbide (SiC) mentioned above is one type of wide gap semiconductor. The wide gap semiconductor means semiconductor generally having a forbidden band width of equal to or greater than about 2 eV. Examples of a material known as the wide gap semiconductor include a group-III nitride such as gallium nitride (GaN), a group-II oxide such as zinc oxide (ZnO), a Group-II chalcogenide such as zinc selenide (ZnSe), and silicon carbide such as diamond.

As illustrated in FIG. 1, the silicon carbide MOSFET 100 has a rectangular outer shape. The silicon carbide MOSFET 100 includes a wide-area gate line 12 extending along an outer edge in a plan view.

A rectangular gate pad 11 is provided in a partial region of a region surrounded by the wide-area gate line 12 in a plan view (this partial region is different from an active region). A spiral gate line 13 is formed around the gate pad 11 in such a manner as to surround the gate pad 11 in a spiral shape of at least one turn or more.

While the spiral gate line 13 illustrated in FIG. 1 has a spiral shape in a plan view, the spiral shape of the spiral gate line 13 may be a spiral shape as viewed from a different direction.

One end portion, namely, one end of the spiral gate line 13 is connected to the gate pad 11. The other end portion, namely, the other end of the spiral gate line 13 is connected to one end of a buried gate resistance 25. The other end of the buried gate resistance 25 is connected to the wide-area gate line 12.

Namely, the spiral gate line 13 and the wide-area gate line 12 are electrically connected to each other through the buried gate resistance 25. The spiral gate line 13 and the wide-area gate line 12 do not contact each other directly.

While the spiral gate line 13 is wound around the gate pad 11, turns of the wound spiral gate line 13 do not contact each other. Namely, the spiral gate line 13 is not formed into a closed ring-like shape (closed curve).

The "spiral shape" mentioned in the present description does not cover a closed ring-like shape (closed curve).

A source electrode 10 is provided in a part other than an area in the presence of the gate pad 11, the wide-area gate line 12, and the spiral gate line 13, which is a large part of a main surface corresponding to the upper surface of the silicon carbide MOSFET 100.

A drain electrode 20 (described later) is provided on a main surface corresponding to the lower surface of the silicon carbide MOSFET 100, which is the main surface on the opposite side of the upper surface in the presence of the source electrode 10.

An active region with a plurality of MOS minimum unit structures called "unit cells" is provided under the source electrode 10. A potential at a gate electrode 7b (described later) in the unit cell is used for controlling the presence or absence of electrical continuity between the source electrode 10 and the drain electrode 20.

An interlayer insulating film 15 (described later) is formed on the upper surface of the gate electrode. Large parts of the source electrode 10, the gate pad 11, the wide-area gate line 12, and the spiral gate line 13 are formed on the interlayer insulating film 15.

In a part of a region in which both the wide-area gate line 12 and a gate electrode 7a (described later) are formed, the interlayer insulating film 15 is partially absent and a gate contact hole 23A is formed in this part. The wide-area gate line 12 and the gate electrode 7a physically contact each other through the gate contact hole 23A to form ohmic contact. The spiral gate line 13 and the gate electrode 7a physically contact each other through a gate contact hole 23B in which the interlayer insulating film 15 is partially absent.

With the configuration described above, a gate voltage applied to the gate pad 11 from an external control circuit (not shown in the drawings) is supplied to the gate electrode 7b in the unit cell through the spiral gate line 13, the buried gate resistance 25, the wide-area gate line 12, and the gate contact hole 23A.

As described above, the spiral gate line 13 exists in a planar region different from the active region.

The spiral gate line 13 is made of metal. On the other hand, in terms of machining performance or characteristic of contact with a gate insulating film 6, the gate electrode 7b in the unit cell is generally made of polycrystalline silicon.

Polycrystalline silicon has a higher sheet resistance than metal. Hence, forming the spiral gate line 13 using polycrystalline silicon like the gate electrode 7b in the unit cell makes the spiral gate line 13 behave like a large gate resistance, failing to realize high-speed switching operation. For this reason, the spiral gate line 13 is made of a different type of material from the gate electrode 7b in the unit cell.

The spiral gate line 13 does not have an electrical branch point at any midway position thereof.

While a wide range of variations can be made according to a MOSFET in terms of the position of the gate pad 11, the number of the gate pads 11, the shape of the buried gate resistance 25, the shape of the wide-area gate line 12, the shape of the source electrode 10, the number of the source electrodes 10, etc., the present technique is applicable to any configuration.

The wide-area gate line 12 is not always required to surround the source electrode 10 or the spiral gate line 13 in a plan view. For example, what is needed is only to form the spiral gate line 13 into a spiral shape between the gate pad 11 and the gate electrode 7b in such a manner as to surround the gate pad 11.

Figure 2:
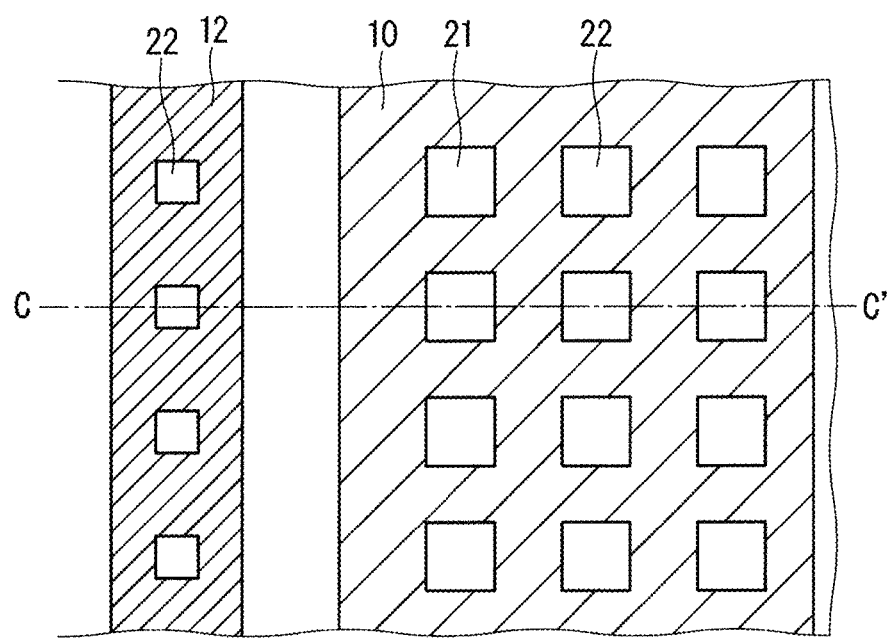
FIG. 2 is an enlarged view of a region A in FIG. 1.

FIG. 2 is an enlarged view of a region A in FIG. 1. As illustrated in FIG. 2, a plurality of well contact holes 21 is provided along the outer edge of the source electrode 10. The well contact holes 21 are arranged adjacent to the active region and are each provided at a lower part of the source electrode 10.

A plurality of source contact holes 22 is provided at a lower part of the source electrode 10 in the active region so as to conform to the arrangement of the unit cell.

Figure 3:
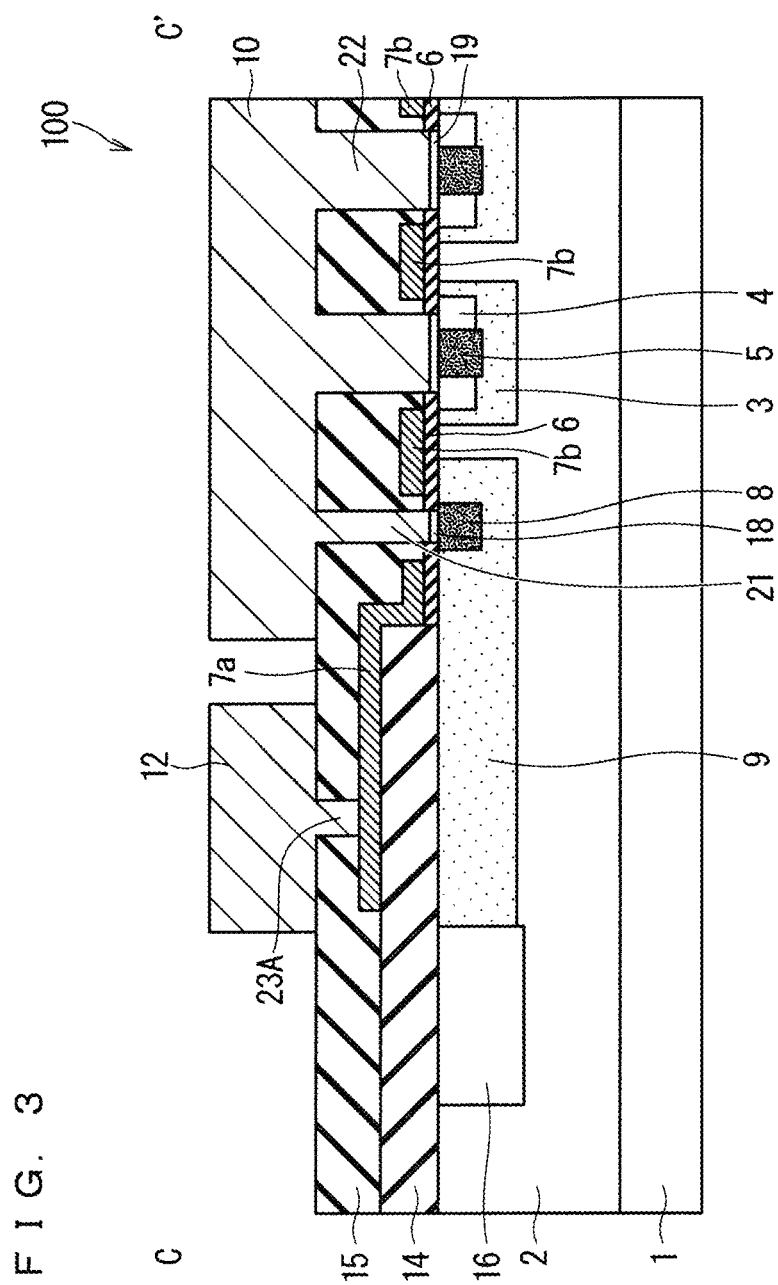
FIG. 3 is a sectional view showing an example of a configuration taken at a section C-C' in FIG. 2.

FIG. 3 is a sectional view showing an example of a configuration taken at a section C-C' in FIG. 2. As illustrated in FIG. 3, the silicon carbide MOSFET 100 is formed on the upper surface of an n$^+$-type SiC substrate 1 containing n-type (first conductivity type) impurity to a relatively high concentration.

An n$^-$-type semiconductor layer containing the n-type impurity to a relatively low concentration is formed on the upper surface of the SiC substrate 1. The semiconductor layer is an epitaxially grown layer formed by epitaxial growth, for example, and will be called a drift layer 2 below.

In a surface layer of the drift layer 2, a plurality of well regions 3 containing p-type (second conductivity type) impurity is formed selectively in the active region. Each of the well regions 3 has a surface layer in which a p$^+$-type contact region 5 containing the p-type impurity to a relatively high concentration is formed selectively.

In the surface layer of each well region 3, an n$^+$-type source region 4 is formed in such a manner as to surround the contact region 5 in a plan view. The contact region 5, which is provided for reducing a contact resistance, is not an essential structure.

The well region 3 and the source region 4 are provided in such a manner as to surround the contact region 5 concentrically in a plan view. The depth of the lower surface of the well region 3 from the top surface of the drift layer 2 is greater than the respective depths of the lower surface of the source region 4 and the lower surface of the contact region 5 from the top surface of the drift layer 2.

An outer peripheral well region 9 containing the p-type impurity is provided in the surface layer of the drift layer 2 in an outer peripheral region forming an outer periphery of the active region in a plan view. The outer peripheral well region 9 extends to a region under the wide-area gate line 12.

In the surface layer of the drift layer 2 in a region still external to the outer peripheral region in a plan view, a plurality of guard ring regions 16 is formed in such a manner as to contact the outer peripheral well region 9.

In a surface layer of the outer peripheral well region 9, a p$^+$-type outer peripheral contact region 8 containing the p-type impurity to a relatively high concentration is formed selectively. An outer peripheral well contact film 18 is provided on the upper surface of the outer peripheral contact region 8.

The outer peripheral contact region 8 is provided adjacent to the active region and is provided at an edge portion of the outer peripheral region. The outer peripheral well contact film 18 is provided on the upper surface of the outer peripheral contact region 8.

The outer peripheral well region 9 is formed to protect the gate electrode from a high voltage applied to the drain electrode. For this reason, the outer peripheral well region 9 is formed under the gate pad 11, the wide-area gate line 12, the spiral gate line 13, and the buried gate resistance 25.

The gate insulating film 6 is formed on the drift layer 2 in the active region while contacting the upper surface of the well region 3 caught between the source region 4 and the drift layer 2. The gate electrode 7b is formed on the upper surface of the gate insulating film 6.

Specifically, the surface layer of the drift layer 2 between the well regions 3 adjacent to each other functions as a junction field effect transistor (JFET) region. The gate electrode 7b is provided on the upper surface of the gate insulating film 6 extending from a position over the JFET region to a position over the well region 3.

A field insulating film 14 is provided in such a manner as to extend over a part of the upper surface of the outer peripheral well region 9 and over the upper surface of the guard ring region 16. The field insulating film 14 has a greater thickness than the gate insulating film 6. The thickness of the field insulating film 14 is equal to or greater than 0.5 μm and equal to or less than 2 μm, for example. The gate electrode 7a, which is continuous with the gate electrode 7b, is provided further on the upper surface of the field insulating film 14.

The gate insulating film 6 is provided in such a manner as to cover the substantially entire upper surface of the drift layer 2 in the active region. On the other hand, a source contact film 19 is provided in an area on the upper surface of the contact region 5 and on a part of the upper surface of the source region 4 around the contact region 5. Thus, the gate insulating film 6 is not formed in this area.

The interlayer insulating film 15 is formed in such a manner as to cover the gate electrode 7a, the gate electrode 7b, the gate insulating film 6, and the field insulating film 14. The interlayer insulating film 15 has a thickness equal to or greater than 0.5 μm and equal to or less than 2 μm, for example.

In the active region, the source contact hole 22 is formed in such a manner as to penetrate the interlayer insulating film 15 to reach the source contact film 19. In the outer peripheral region, the well contact hole 21 is provided in such a manner as to penetrate the interlayer insulating film 15 to reach the outer peripheral well contact film 18. In the outer peripheral region, the gate contact hole 23A is provided in such a manner as to penetrate the interlayer insulating film 15 to reach the gate electrode 7a formed on the upper surface of the field insulating film 14.

The source electrode 10, the gate pad 11, the wide-area gate line 12, and the spiral gate line 13 are provided selectively over the interlayer insulating film 15.

The source electrode 10 closes the source contact hole 22 and closes the well contact hole 21 provided adjacent to the active region. The wide-area gate line 12 closes the gate contact hole 23A. In the active region, the source electrode 10 covers the gate electrode 7b across the interlayer insulating film 15.

With the configuration described above, the source region 4 becomes electrically connected to the source electrode 10 through the source contact hole 22, the outer peripheral well region 9 becomes electrically connected to the source electrode 10 through the well contact hole 21, and the gate electrode 7a becomes electrically connected to the wide-area gate line 12 through the gate contact hole 23A.

A protective film made of a polyimide film or a nitride film is provided over the interlayer insulating film 15 in such a manner as to cover at least a part of the source electrode 10 (this protective film is not shown in the drawings).

Figure 4:
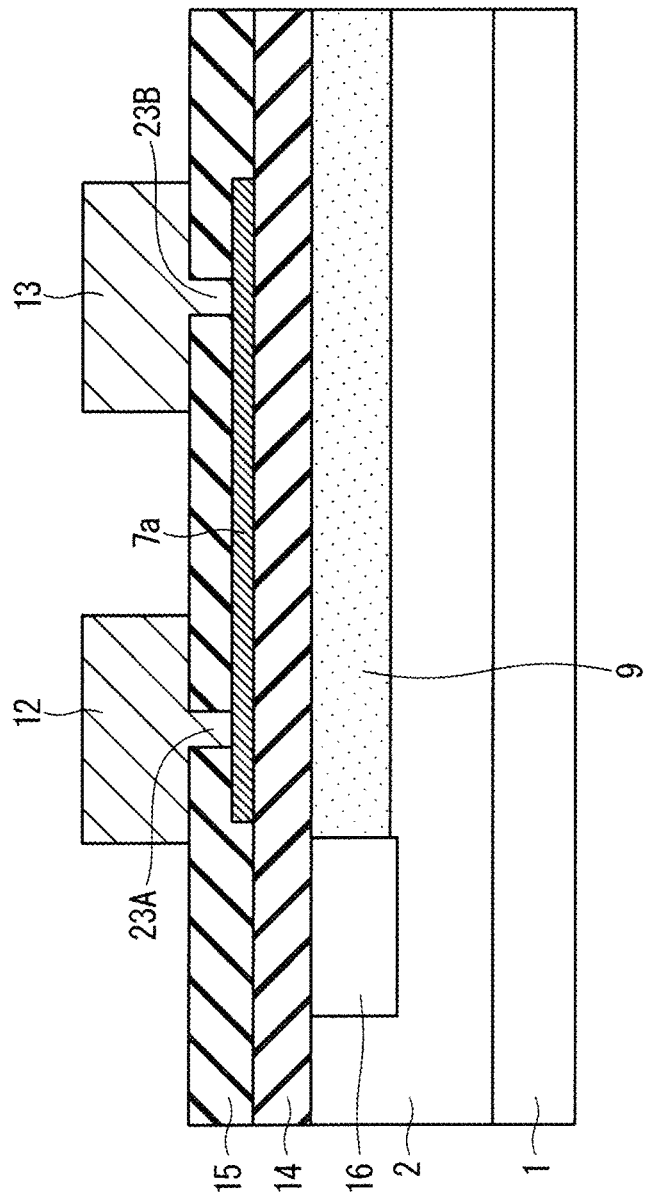
FIG. 4 is a sectional view showing an example of a configuration taken at a section B-B' in FIG. 1.

The following describes a region in which the buried gate resistance 25 is formed. FIG. 4 is a sectional view showing an example of a configuration taken at a section B-B' in FIG. 1. The sectional view in FIG. 4 is defined in a region different from the active region.

As illustrated in FIG. 4, the gate electrode 7a is formed partially on the upper surface of the field insulating film 14. Each of the gate contact hole 23A and the gate contact hole 23B is formed in such a manner as to penetrate the interlayer insulating film 15 formed on the upper surface of the gate electrode 7a to reach the gate electrode 7a.

In the gate contact hole 23B, the spiral gate line 13 contacts the gate electrode 7a through the gate contact hole 23B. In the gate contact hole 23A, the wide-area gate line 12 contacts the gate electrode 7a through the gate contact hole 23A.

As a result, the spiral gate line 13 and the wide-area gate line 12 become electrically connected to each other through the buried gate resistance 25 (mainly resulting from the gate electrode 7a).

<Method of Manufacturing Semiconductor Device>

A method of manufacturing the silicon carbide semiconductor device according to the first embodiment will be described next by referring to FIGS. 5 to 9. FIGS. 5 to 9 are sectional views each showing an example of the method of manufacturing the silicon carbide semiconductor device according to the first embodiment.

Figure 5:
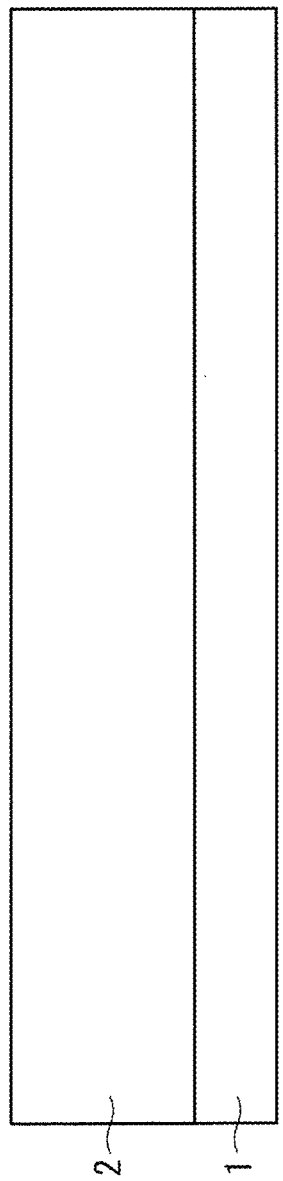
FIG. 5 is a sectional view showing an example of a method of manufacturing the silicon carbide semiconductor device according to the embodiment.

First, as illustrated in FIG. 5, the n-type drift layer 2 is formed by epitaxial growth on one main surface (upper surface) of the SiC substrate 1 by chemical vapor deposition (namely, CVD) process. The drift layer 2 is a silicon carbide semiconductor layer.

The thickness of the grown SiC substrate 1 is equal to or greater than 50 μm and equal to or less than 500 μm, for example. The SiC substrate 1 contains the n-type impurity in a range from $1\times10^{19}$ to $1\times10^{21}$ cm$^{-3}$, for example.

The thickness of the drift layer 2 is equal to or greater than 1 μm and equal to or less than 60 μm, for example. The drift layer 2 contains the n-type impurity in a range from $1\times10^{15}$ to $1\times10^{17}$ cm$^{-3}$, for example.

This thickness of the drift layer 2 is given as an example. The thickness of the drift layer 2 may be determined in a manner that depends on a breakdown voltage (working voltage) required in the silicon carbide MOSFET 100.

Next, a resist mask with openings (not shown in the drawings) is formed on the upper surface of the drift layer 2 using photolithography technique in such a manner as to expose regions to become the well region 3 and the outer peripheral well region 9 later. This resist mask is used as an impurity implantation blocking mask.

Figure 6:
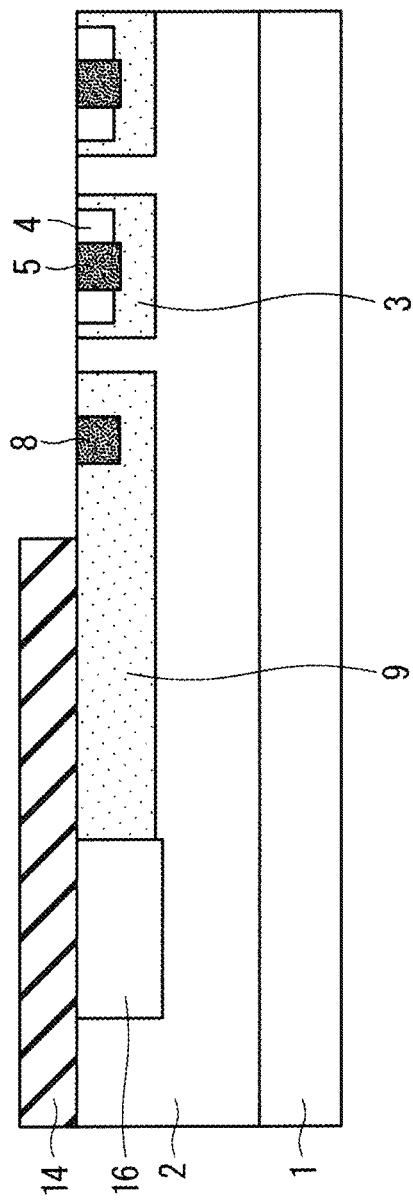
FIG. 6 is a sectional view showing an example of the method of manufacturing the silicon carbide semiconductor device according to the embodiment.

After formation of the foregoing resist mask, the p-type impurity is ion-implanted from above this resist mask. Then, as illustrated in FIG. 6, the well region 3 is formed selectively in the surface layer of the drift layer 2 in the active region. As illustrated in FIG. 6, the outer peripheral well region 9 is formed in the surface layer of the drift layer 2 in the outer peripheral region.

The depth (thickness) of each of the well region 3 and the outer peripheral well region 9 from the top surface of the drift layer 2 is equal to or greater than 0.5 μm and equal to or less than 1.0 μm, for example. The p-type impurity used in each of the well region 3 and the outer peripheral well region 9 is Al or B. An impurity concentration in each of the well region 3 and the outer peripheral well region 9 is set in a range from $1\times10^{17}$ to $5\times10^{19}$ cm$^{-3}$, for example.

Next, the resist mask is removed, and then a new resist mask with an opening (not shown in the drawings) is formed using photolithography technique in such a manner as to expose a region to become the source region 4 later. This resist mask is also used as an impurity implantation blocking mask.

After formation of this resist mask, the n-type impurity is ion-implanted from above this resist mask. Then, as illustrated in FIG. 6, the source region 4 is formed in the surface layer of the well region 3.

The depth (thickness) of the source region 4 from the top surface of the drift layer 2 is equal to or greater than 0.2 μm and equal to or less than 0.5 μm, for example. The n-type impurity used in the source region 4 is nitrogen (N) or phosphorus (P). An impurity concentration in the source region 4 is set in a range from $5\times10^{18}$ to $5\times10^{20}$ cm$^{-3}$, for example.

Next, the resist mask is removed, and then a new resist mask with openings (not shown in the drawings) is formed using photolithography technique in such a manner as to expose regions to become the contact region 5 and the outer peripheral contact region 8 later. This resist mask is also used as an impurity implantation blocking mask.

After formation of this resist mask, the p-type impurity is ion-implanted from above this resist mask. Then, as illustrated in FIG. 6, the contact region 5 is formed in a central part of the source region 4 in the active region in a plan view. As illustrated in FIG. 6, in the outer peripheral region, the outer peripheral contact region 8 is further formed in the surface layer of the outer peripheral well region 9.

The depth (thickness) of each of the contact region 5 and the outer peripheral contact region 8 from the top surface of the drift layer 2 is equal to or greater than 0.2 μm and equal to or less than 0.5 μm, for example.

The p-type impurity used in each of the contact region 5 and the outer peripheral contact region 8 is Al or B. An impurity concentration in each of the contact region 5 and the outer peripheral contact region 8 is set in a range from $1 \times 10^{18}$ to $5 \times 10^{20}$ cm$^{-3}$, for example.

Next, the resist mask is removed, and then a new resist mask with an opening (not shown in the drawings) is formed using photolithography technique in such a manner as to expose a region to become the guard ring region 16 later. This resist mask is also used as an impurity implantation blocking mask.

After formation of this resist mask, the p-type impurity is ion-implanted from above this resist mask. Then, as illustrated in FIG. 6, the guard ring region 16 is formed in the surface layer of the drift layer 2 still external to the outer peripheral region.

The depth (thickness) of the guard ring region 16 from the top surface of the drift layer 2 is equal to or greater than 0.5 μm and equal to or less than 1.0 μm, for example. The p-type impurity used in the guard ring region 16 is Al or B. An impurity concentration in the guard ring region 16 is set in a range from $1 \times 10^{16}$ to $1 \times 10^{18}$ cm$^{-3}$, for example.

Next, the resist mask is removed, and then high-temperature annealing treatment is performed at a temperature of equal to or greater than 1500° C., for example, for activating the implanted n-type impurity and p-type impurity.

Next, an oxide film (SiO$_2$) is formed on the upper surface of the drift layer 2 by CVD process, for example. Then, an etching mask with an opening is formed using photolithography technique in such a manner as to expose the active region.

After formation of this etching mask, the oxide film in the active region is removed by etching using this etching mask. By doing so, as illustrated in FIG. 6, the field insulating film 14 is formed on the upper surface of the drift layer 2 in the outer peripheral region. The thickness of the field insulating film 14 is set to be equal to or greater than 0.5 μm and equal to or less than 2 μm, for example.

Figure 7:
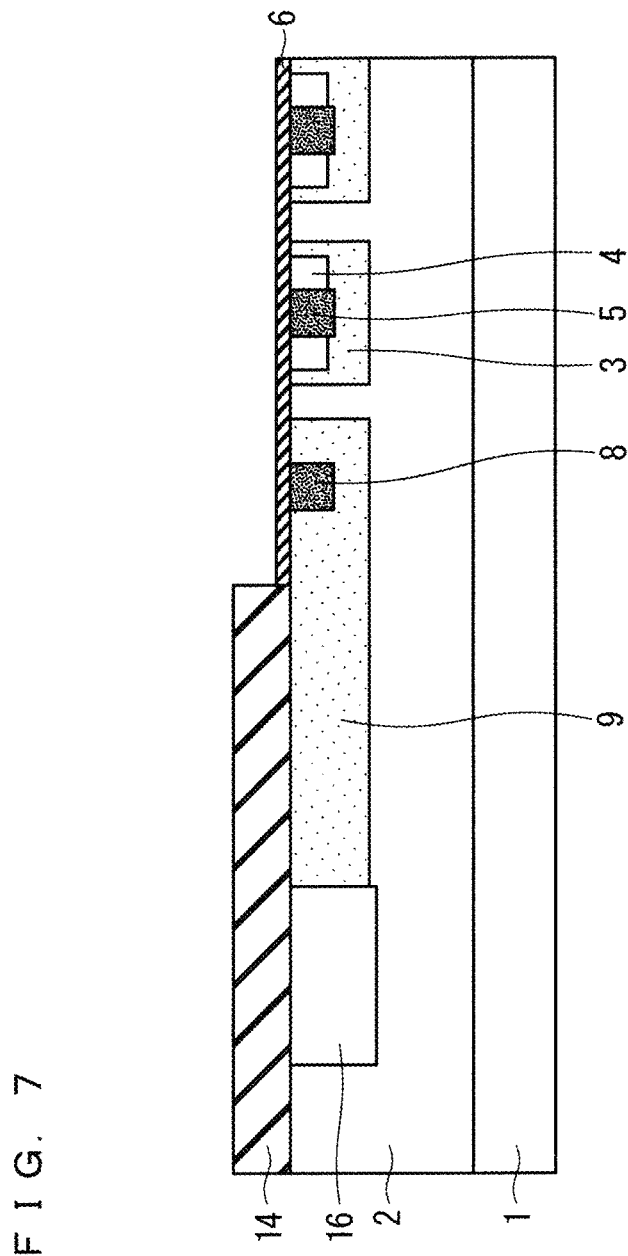
FIG. 7 is a sectional view showing an example of the method of manufacturing the silicon carbide semiconductor device according to the embodiment.

Next, as illustrated in FIG. 7, the SiC substrate 1 with the foregoing structures is exposed to an atmosphere of about 1000° C. containing oxygen or water vapor to thermally oxide the surface of the active region. As a result, the gate insulating film 6 made of the thermally oxidized film is formed. The thickness of the gate insulating film 6 is set to be equal to or greater than 0.03 μm and equal to or less than 0.5 μm, for example.

While the gate insulating film 6 has been shown as the thermally oxidized film in the case described above, the gate insulating film 6 may alternatively be an oxide film formed by CVD process.

Figure 8:
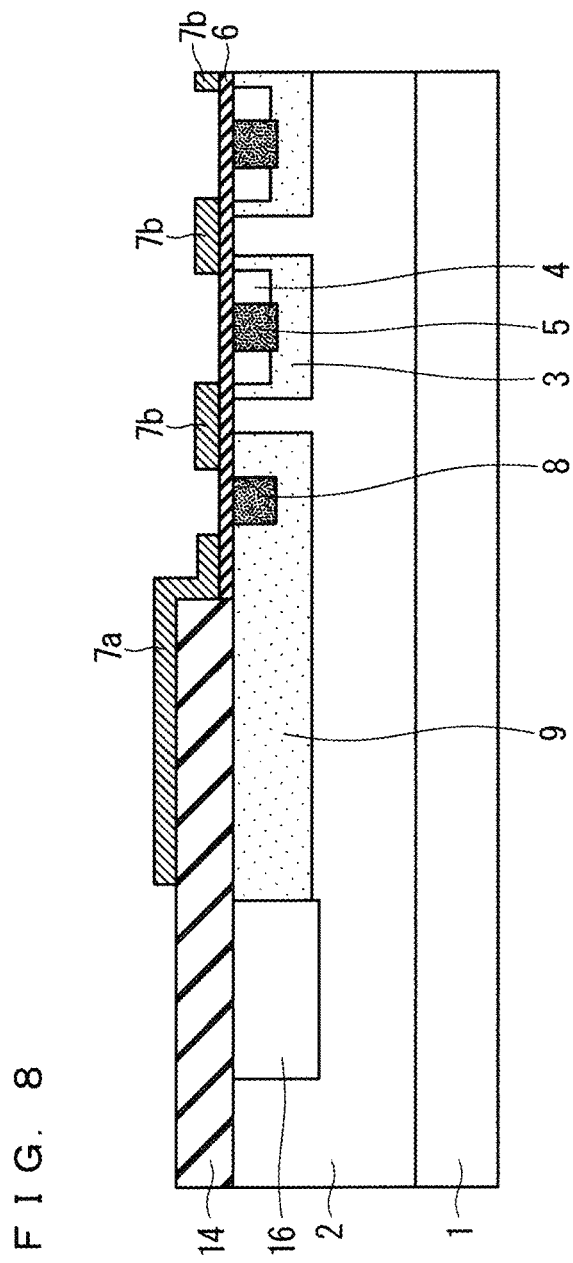
FIG. 8 is a sectional view showing an example of the method of manufacturing the silicon carbide semiconductor device according to the embodiment.

Next, as illustrated in FIG. 8, a polycrystalline silicon film containing phosphorus (P) in a range from $1 \times 10^{19}$ to $1 \times 10^{21}$ cm$^{-3}$, for example, is formed by CVD process on the upper surface of the gate insulating film 6 and on the upper surface of the field insulating film 14.

The thickness of the polycrystalline silicon film is set in a range from 0.3 to 1 μm, for example. The polycrystalline silicon film may alternatively be formed of a p-type polycrystalline silicon film containing B.

Next, an etching mask with openings is formed using photolithography technique in such a manner as to expose the polycrystalline silicon film over the source region 4 and over the contact region 5 in the active region and to expose the polycrystalline silicon film under the gate pad 11 in the outer peripheral region.

After formation of this etching mask, the polycrystalline silicon film exposed at the openings is removed by etching using this etching mask.

By doing so, as illustrated in FIG. 8, in the active region, the gate electrode existing over the source region 4 and existing over the contact region 5 is removed to form the gate electrode 7b remaining in a range from a position over the JFET region to a position over an edge of the well region 3. In the outer peripheral region, the gate electrode 7a under the wide-area gate line 12 remains while not remaining at a position over the outer peripheral contact region 8.

Furthermore, the pattern of the buried gate resistance 25 is formed at the section B-B' shown in FIG. 1.

Figure 9:
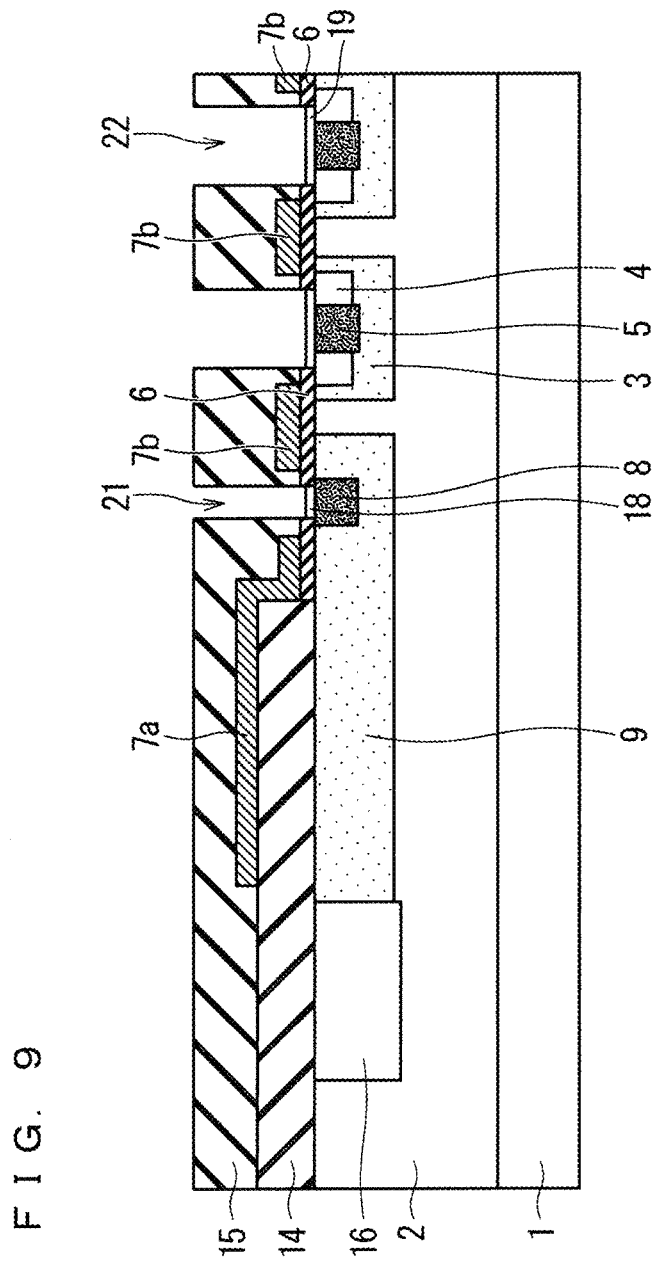
FIG. 9 is a sectional view showing an example of the method of manufacturing the silicon carbide semiconductor device according to the embodiment.

Next, as illustrated in FIG. 9, a silicon oxide film is formed to a thickness of equal to or greater than 0.5 μm and equal to or less than 2 μm by CVD process, for example, on the entire surface of the SiC substrate 1 including the foregoing structures, and the resultant silicon oxide film becomes the interlayer insulating film 15.

Then, an etching mask with openings is formed using photolithography technique in such a manner as to expose the interlayer insulating film 15 over the contact region 5 and over the source region 4 around this contact region 4 in the active region. Then, the interlayer insulating film 15 exposed at the openings and the gate insulating film 6 under this interlayer insulating film 15 are removed by etching using this etching mask. By doing so, as illustrated in FIG. 9, the source contact hole 22 reaching the contact region 5 and the source region 4 around this contact region 5 is formed (see FIG. 3).

In the outer peripheral region, this etching mask has an opening formed in such a manner as to expose the interlayer insulating film 15 over the outer peripheral well region 9. The interlayer insulating film 15 and the field insulating film 14 exposed at the opening are removed by etching. By doing so, as illustrated in FIG. 9, the well contact hole 21 reaching the outer peripheral well region 9 is formed.

Either wet etching or dry etching, or both the wet etching and the dry etching are applicable to the foregoing etching.

Next, this etching mask is removed. Then, an Ni film is formed to a thickness of equal to or greater than 30 nm and equal to or less than 100 nm by sputtering process, for example, on the upper surface of the SiC substrate 1. Then, annealing treatment is performed.

By doing so, a metal silicide film (an NiSi$_2$ film, for example) is formed on each of the upper surface of the source region 4 and the upper surface of the contact region 5 exposed at the bottom surface of the source contact hole 22, and the upper surface of the outer peripheral contact region 8 exposed at the bottom surface of the well contact hole 21.

The annealing treatment mentioned herein is performed using rapid thermal annealing (namely, RTA) process, for example, by heating at a temperature of equal to or greater than 300° C. and equal to or less than 800° C., for example, for a duration of equal to or greater than one minute and equal to or less than three minutes.

As illustrated in FIG. 9, as a result of the heating at this temperature, Ni in the Ni film and SiC contacting Ni react with each other to form the source contact film 19 on the upper surface of the contact region 5 and on the upper surface of the source region 4 (see FIG. 3), while the outer peripheral well contact film 18 is formed on the outer peripheral contact region 8 (see FIG. 3). The Ni film not contacting SiC does not cause reaction to remain as it is as Ni.

After formation of the metal silicide film, the SiC substrate 1 is cleaned with an acid solution containing sulfuric acid or hydrochloric acid, for example. As a result of this cleaning, the Ni film unreacted during the reaction for silicide formation is removed.

As a result of removal of the unreacted Ni film, the configuration illustrated in FIG. 9 is obtained.

Next, an etching mask with a plurality of openings is formed using photolithography technique in such a manner as to expose the interlayer insulating film 15 located over the gate electrode 7a in a region for forming the gate pad 11 (see FIG. 1) and in a region for forming the wide-area gate line 12 (see FIG. 1).

Then, the interlayer insulating film 15 exposed at these openings is removed by etching using this etching mask to form the gate contact hole 23A and the gate contact hole 23B reaching the gate electrode 7a (see FIG. 4).

This etching can be performed using the same method as that used for the etching for forming the source contact hole 22.

Then, an Al film is formed to a thickness of equal to or greater than 1 µm and equal to or less than 5 µm, for example, by sputtering process or vapor deposition process on the upper surface of the SiC substrate 1. The well contact hole 21, the source contact hole 22, the gate contact hole 23A, and the gate contact hole 23B are buried using the resultant Al film.

Next, photolithography technique is used to form an etching mask having openings formed at parts other than parts over respective regions to become the source electrode 10, the gate pad 11, the wide-area gate line 12, and the spiral gate line 13 later.

Then, the Al film is etched using this etching mask to form the source electrode 10, the gate pad 11, the wide-area gate line 12, and the spiral gate line 13.

Finally, an Ni film is formed to a thickness of equal to or greater than 0.1 µm and equal to or less than 5 µm, for example, by sputtering process or vapor deposition process on a main surface on the back side (lower surface) of the SiC substrate 1. The resultant Ni film becomes the drain electrode 20. By doing so, the silicon carbide MOSFET 100 illustrated in FIG. 3 is obtained.

Effect achieved by the silicon carbide MOSFET 100 will be described next.

Figure 12:
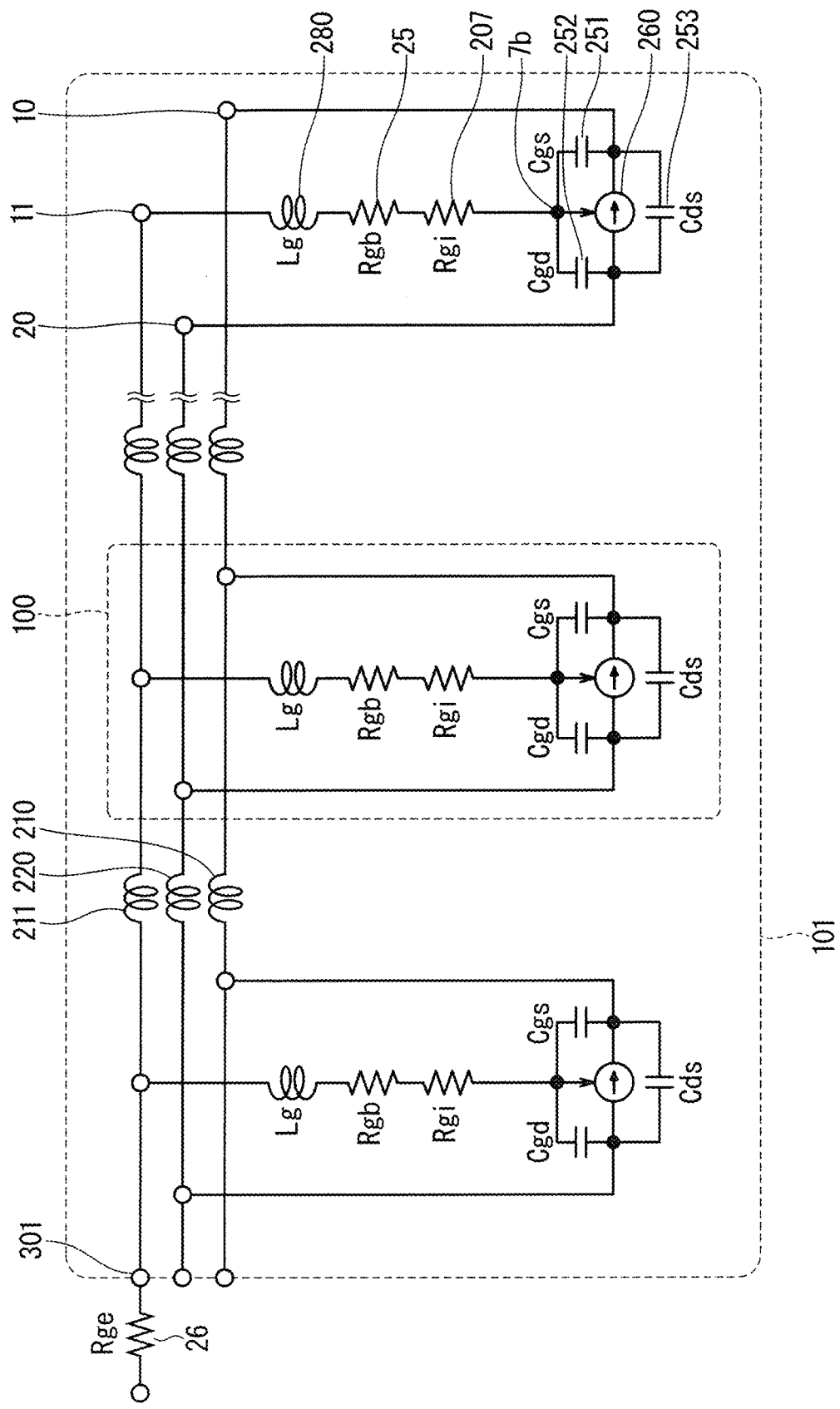
FIG. 12 shows an example of an equivalent circuit model for a power semiconductor module on which the silicon carbide MOSFET according to the embodiment is mounted.

FIG. 12 shows an example of an equivalent circuit model for a power semiconductor module 101 (power converter) on which the silicon carbide MOSFET 100 according to the first embodiment is mounted.

The power semiconductor module 101 includes a plurality of the silicon carbide MOSFETs 100 arranged therein and connected in parallel to each other.

More specifically, connections are established between the respective gate pads 11, between the respective drain electrodes 20, and between the respective source electrodes 10 of the silicon carbide MOSFETs 100 through a gate parasitic inductance 211, a drain parasitic inductance 220, and a source parasitic inductance 210 respectively that are inductance components parasitic in between the silicon carbide MOSFETs 100.

The gate parasitic inductance 211, the drain parasitic inductance 220, and the source parasitic inductance 210 result from the presence of an elongated conductor such as a wire bond or a bus bar used for the parallel connection between chips of the silicon carbide MOSFETs 100.

With attention given to the interior of the silicon carbide MOSFET 100, the drain electrode 20 and the source electrode 10 are low-resistance metals and formed in a planar pattern in the plane of the chip. This makes a parasitic impedance ignorable.

On the other hand, the gate electrode 7a, which is made of the polycrystalline silicon film, has a high sheet resistance. Thus, an internal resistance 207 is considered to be present between the gate pad 11 and the gate electrode 7b in the active region.

In the active region, parasitic capacitances including a gate-source capacitance 251, a gate-drain capacitance 252, and a source-drain capacitance 253 are present between the respective terminals of a gate, a source, and a drain. Also, a channel conductance 260 having electrical conductivity controlled using a potential at the gate electrode 7b in the active region is present between the drain and the source.

As the spiral gate line 13 in the silicon carbide MOSFET 100 according to the first embodiment is a line having a spiral shape, it functions as a spiral coil in terms of electrical aspect and can be expressed as an inductance component.

One end of the spiral gate line 13 is connected to the gate pad 11 and the other end of the spiral gate line 13 is connected to the gate electrode 7b in the active region. For this reason, the inductance component resulting from the spiral gate line 13 can be expressed as a buried gate inductance 280 formed between the gate pad 11 and the active region.

The buried gate resistance 25, which is not an essential structure of the first embodiment, is connected in series to the buried gate inductance 280.

The module has a gate terminal 301 to which an external gate resistor 26 for adjusting a switching speed is connected.

A mechanism for gate oscillation generated in the module with a plurality of parallel-connected MOSFETs will be described first.

The gate oscillation is caused by propagation of high-frequency oscillation input to the gate pad 11 of a MOSFET to a potential at the gate electrode 7b in an active region of the MOSFET and transfer of the propagated high-frequency to oscillation in a drain-source current.

The oscillation in the drain-source current is changed to voltage fluctuation at the source electrode or the drain electrode of the silicon carbide MOSFET 100 by the source parasitic inductance 210 or the drain parasitic inductance 220, and returns as voltage oscillation at the gate pad 11 of the silicon carbide MOSFET 100 as an origin through the gate-source capacitance 251 and the gate-drain capacitance 252 in the module or in a different silicon carbide MOSFET 100.

In this case, if the returning oscillating voltage at a gate potential is higher than an initial oscillating voltage at the gate potential, positive feedback is generated. In some cases, this leads to the gate oscillation.

For this reason, reducing a gain of a small-signal transfer function in the oscillation loop described above relative to the high-frequency oscillation is effective in suppressing the gate oscillation. This may be realized by a specific method of reducing the ratio of potential fluctuation at the gate electrode 7b in the active region relative to voltage fluctuation at the gate pad 11.

On the other hand, if potential fluctuation at the gate electrode 7b in the active region is slowed relative to change in a control voltage at the gate electrode to be applied to the gate pad 11 for switching operation, a switching speed is reduced to cause increase in power loss.

For this reason, voltage fluctuation at the gate electrode 7b in the active region relative to voltage fluctuation at the gate pad 11 is ideally made to respond to switching operation and not to respond to the high-frequency oscillation.

The high-frequency oscillation mentioned herein has an oscillation frequency calculated as $1/(2\pi\sqrt{(LC)})$, which is a frequency of resonance between a parasitic capacitance C mainly parasitic in a semiconductor chip and a parasitic inductance L mainly parasitic in a circuit. As C is generally from a few tens to a few hundred nF and L is generally from a few tens to a few hundred nH, the resonance frequency has an oscillation frequency generally from a few to a hundred MHz.

This is a frequency higher than the frequency of a control voltage at the gate electrode in view of a general switching frequency that is about a few hundred kHz.

For the reason given above, the present inventors have reached an idea that, if a low-pass filter to block only a high-frequency signal and to cause no influence on transmission of a low-frequency signal can be formed between the gate pad 11 and the gate electrode 7b in the active region, the gate oscillation can be suppressed without causing increase in switching loss.

Figure 13:
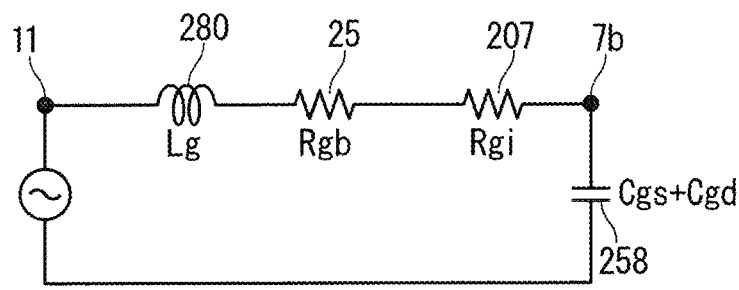
FIG. 13 shows a small-signal equivalent circuit for analyzing a degree of potential fluctuation occurring at a gate electrode in an active region when a single silicon carbide MOSFET is extracted and a sine wave is applied to a gate pad.

FIG. 13 shows a small-signal equivalent circuit for analyzing a degree of potential fluctuation occurring at the gate electrode 7b in the active region when a single silicon carbide MOSFET 100 is extracted and a sine wave is applied to the gate pad 11.

By disregarding an impedance between the source and the drain not to contribute to this analysis and making simplification by regarding a source potential and a drain potential as the same potential in the silicon carbide MOSFET 100 shown in FIG. 12, an input capacitance 258 corresponding to a combined capacitance of the gate-source capacitance 251 and the gate-drain capacitance 252 is expressed as being connected in series to the buried gate resistance 25, the buried gate inductance 280, and the internal resistance 207.

If the silicon carbide MOSFET 100 according to the first embodiment is not used, namely, if the value of the buried gate inductance 280 is zero, a voltage applied to the gate pad 11 is distributed to the series connection between the internal resistance 207 and the input capacitance 258. A potential at the gate electrode 7b in the active region corresponds to a voltage across the input capacitance 258, which is part of the distributed voltage.

With a potential at the gate pad 11 connected from the active region through the buried gate resistance 25 defined as an input and a potential at the gate electrode 7b in the active region defined as an output, it can be considered that R composed of a combination of the internal resistance 207 and the buried gate resistance 25 and C composed of the input capacitance 258 form a CR low-pass filter between the input and the output.

Namely, the MOSFET can be understood to include a self-generated buried low-pass filter. However, the CR low-pass filter is a primary low-pass filter with a constant attenuation slope of −20 dB/dec. Hence, a cutoff frequency determined by $1/(2\pi Rc)$ is required to be reduced for reducing a gain relative to high-frequency oscillation. Namely, a CR product is required to be increased.

On the other hand, as a switching speed is inversely proportional to the CR product, using only the CR low-pass filter disadvantageously results in a tradeoff relationship between improvement in switching speed and reduction in gain relative to the high-frequency oscillation.

For this reason, if the buried gate inductance 280 is zero, it is hard to suppress the gate oscillation without causing increase in switching loss.

In the silicon carbide MOSFET 100 according to the first embodiment, the buried gate inductance 280 composed of the spiral gate line 13 and provided between the active region and the gate pad 11 is connected in series to the buried gate resistance 25. As a result, an LCR low-pass filter is formed.

The LCR low-pass filter is a secondary low-pass filter, which means that an attenuation slope can be set to −40 dB/dec at a maximum. This makes it possible to reduce a gain relative to the high-frequency oscillation without causing reduction in switching speed, compared to the case in the presence of the CR low-pass filter.

To prove the foregoing effect, the following shows calculation result of a transfer function indicating the level of an output signal from the gate electrode 7b in the active region relative to an input signal to the gate pad 11 in the small-signal equivalent circuit illustrated in FIG. 13.

Figure 14:
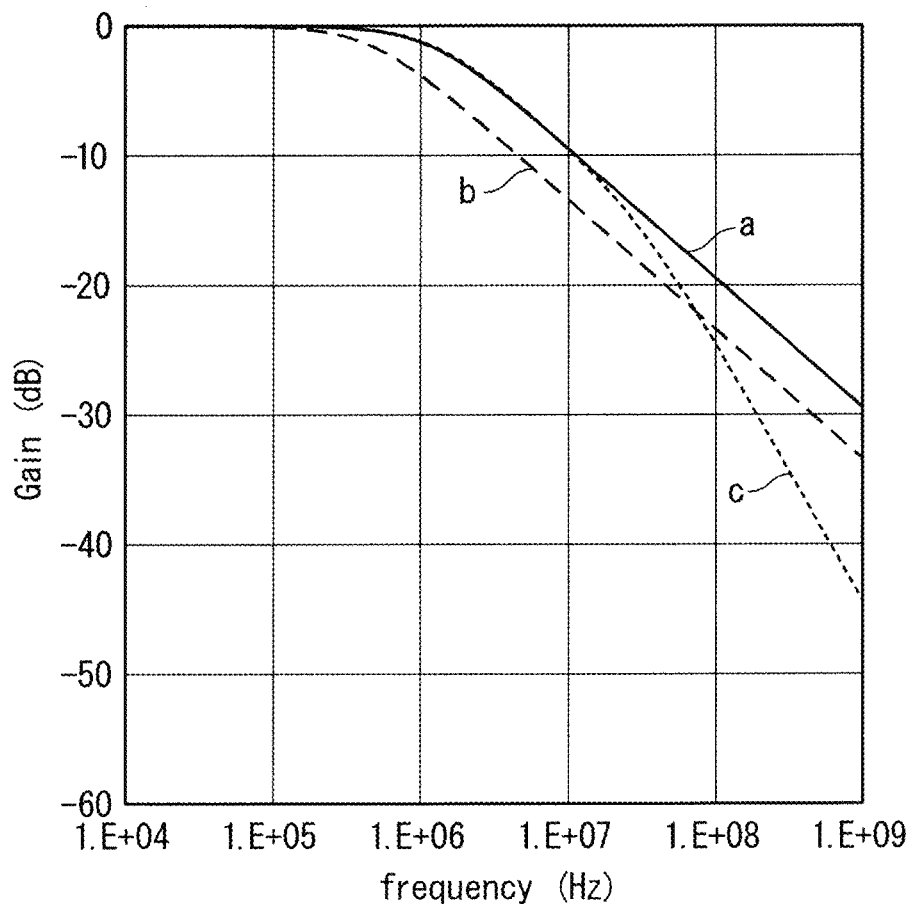
FIG. 14 shows calculation result of a transfer function indicating the level of an output signal from the gate electrode in the active region relative to an input signal to the gate pad.

FIG. 14 shows calculation result of the transfer function indicating the level of an output signal from the gate electrode 7b in the active region relative to an input signal to the gate pad 11. In FIG. 14, a vertical axis shows gain [dB] and a horizontal axis shows a frequency [Hz].

The input capacitance 258 is set to 20 nF, the internal resistance 207 is set to 5Ω, and a combination of the buried gate resistance 25 and the buried gate inductance 280 is set to 1Ω and 0 nH under a condition a, to 10Ω and 0 nH under a condition b, and to 1 Ω and 30 nH under a condition c.

With the condition a as a reference, the cutoff frequency is reduced while the same attenuation slope is maintained under the condition b to reduce a gain in a high-frequency region. On the other hand, with the condition a as a reference, the attenuation slope becomes larger in a region of equal to or greater than 10 MHz under the condition c to reduce a gain in the high-frequency region.

This shows that, with the condition a as a reference, a gain in the high-frequency region can be reduced both under the condition b and under the condition c.

Figure 15:
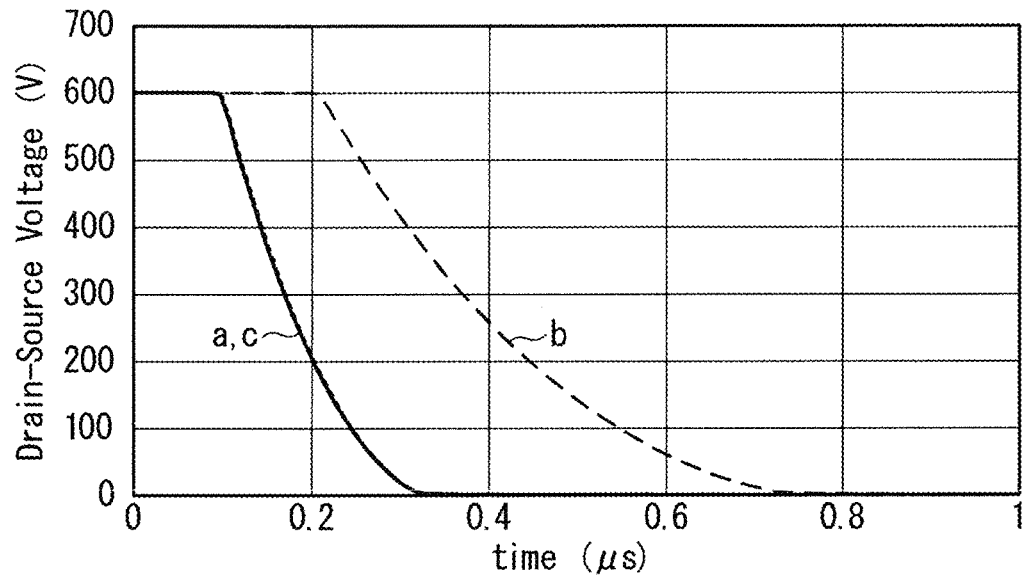
FIG. 15 shows result of calculation of a switching characteristic in an L load half-bridge circuit calculated using the module equivalent circuit model shown in FIG. 12 under the same condition as that in FIG. 14.
Figure 16:
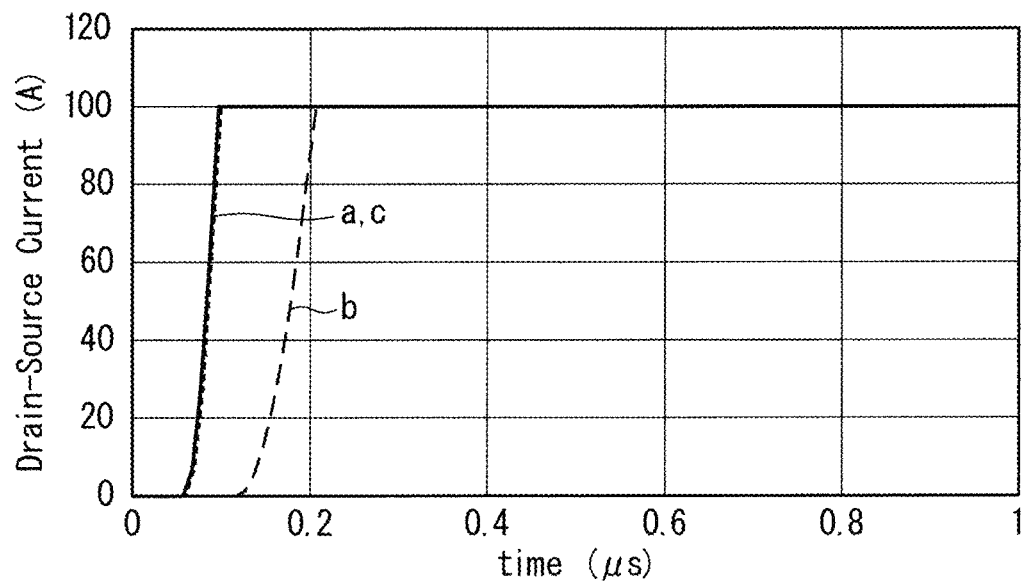
FIG. 16 shows result of calculation of a switching characteristic in the L load half-bridge circuit calculated using the module equivalent circuit model shown in FIG. 12 under the same condition as that in FIG. 14.

FIGS. 15 and 16 each show result of calculation of a switching characteristic in an L load half-bridge circuit calculated using the module equivalent circuit model shown in FIG. 12 under the same condition as that in FIG. 14. In FIG. 15, a vertical axis shows a drain-source voltage [V] and a horizontal axis shows time [μs]. In FIG. 16, a vertical axis shows a drain-source current [A] and a horizontal axis shows time [μs].

For the sake of simplification, the gate parasitic inductance 211, the source parasitic inductance 210, and the drain parasitic inductance 220 are disregarded in making the calculation.

A resistance corresponding to 1Ω for each silicon carbide MOSFET 100 is connected to the external gate resistor 26.

With the condition a as a reference, gain in the high-frequency region can be reduced by increasing the buried gate resistance 25 under the condition b. However, fluctuation in a drain current or in a drain voltage is slowed under the condition b, showing that reduction in switching speed occurs.

By contrast, the condition c in the presence of the buried gate inductance 280 results in a switching characteristic comparable to that achieved under the condition a, showing that reduction in switching speed does not occur.

That is, providing the buried gate inductance 280 based on the spiral gate line 13 according to the first embodiment makes it possible to suppress the gate oscillation without causing increase in switching loss.

In consideration of the foregoing effect disclosed for the first time by the inventors, differences from prior arts will be described.

In a configuration disclosed as one prior art, in order to control a time difference between shutdown operations within an element plane occurring during turn-off operation, a trench gate electrode connected to a gate pad formed at the center of a semiconductor chip is formed into a spiral shape.

In a configuration disclosed as another prior art, in order to reduce the area of a gate line, trench gate electrodes are tied like beads into a spiral shape in such a manner as to surround a gate pad.

In either case, the spiral gate line is composed of a gate electrode in an active region.

In such cases, two problems are raised to make it substantially impossible to achieve effect such as that achieved by the first embodiment.

First, according to each of these prior arts, the spiral gate line is composed of the gate electrode in the active region. While polycrystalline silicon is used for forming the gate electrode in the active region in terms of machining performance or reliability of a gate insulating film, polycrystalline silicon has a large sheet resistance.

Hence, using polycrystalline silicon for forming a long line such as a spiral gate line makes the line behave like a large gate resistance, making it impossible to achieve high-speed switching.

Furthermore, forming the spiral gate line only in the active region results in substantially no inductance component between the gate pad and the gate electrode in a partial region of the active region electrically close to the gate pad. Thus, high-frequency oscillation is unfortunately transmitted to these regions. As a result, it becomes substantially impossible to suppress the gate oscillation.

Additionally, in the active region, a large difference in inductance component formed between the active region and the gate pad is caused between an area electrically close to the gate pad and an area electrically far from the gate pad. This causes non-uniform switching operation in an element, and this may cause element breakdown due to current concentration.

In order to achieve the effect of the first embodiment while suppressing the foregoing phenomena, the spiral gate line is required to be formed at least partially, desirably entirely, in a region different from the active region, and the spiral gate line is required to be formed between the gate pad and the gate electrode in the active region.

<First Modification of First Embodiment>

The plan view of the silicon carbide MOSFET 100 shown in FIG. 1 is an example of the configuration by which the effect of the first embodiment can be achieved. The effect of the first embodiment is also achieved, if the buried gate inductance 280 is formed between the gate pad 11 and the gate electrode 7b in the active region.

Figure 10:
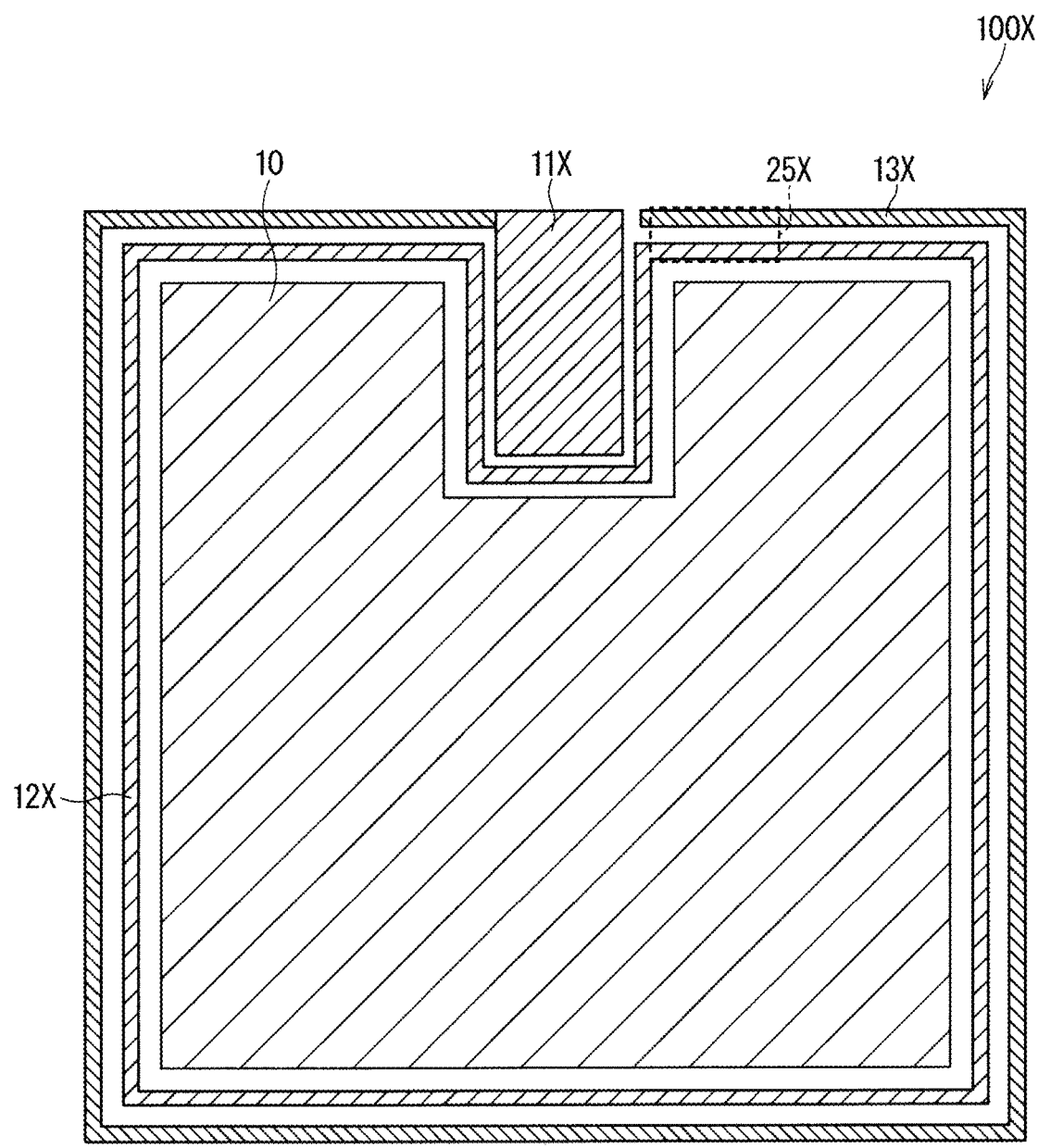
FIG. 10 is a plan view schematically showing a modification of the configuration of a silicon carbide MOSFET according to the embodiment.

FIG. 10 is a plan view schematically showing a modification of the configuration of a silicon carbide MOSFET 100X according to the first embodiment.

In the silicon carbide MOSFET 100X illustrated in FIG. 10, instead of making an annular gate line 13X surround a gate pad 11X, the annular gate line 13X surrounds the active region (source electrode 10) from outside the active region.

While the annular gate line 13X circulates around the active region, turns of the circulating annular gate line 13X do not contact each other. Namely, the annular gate line 13X is not formed into a closed ring-like shape (closed curve).

One end of the annular gate line 13X is connected to the gate pad 11X. The other end of the annular gate line 13X is not connected to the gate pad 11X (namely, the annular gate line 13X is not formed into a closed curve) but is connected to one end of a buried gate resistance 25X. The other end of the buried gate resistance 25X is connected to a wide-area gate line 12X.

The annular gate line 13X is made of a different type of material from the gate electrode 7b.

Even in the foregoing planar layout, it is still possible to form a buried gate inductance resulting from a spiral coil between the gate pad 11X and the gate electrode 7b in the active region, making it possible to achieve effect comparable to that achieved by the first embodiment.

According to the example described in the first embodiment, the order of connection is as follows: the gate pad 11X (gate pad 11), the annular gate line 13X (spiral gate line 13), the buried gate resistance 25X (buried gate resistance 25), and the wide-area gate line 12X (wide-area gate line 12). However, the order of connection may be reversed between the annular gate line 13X (spiral gate line 13) and the buried gate resistance 25X (buried gate resistance 25). The connection may include an optional gate line, for example, interposed at some point in the connection.

<Second Modification of First Embodiment>

Figure 11:
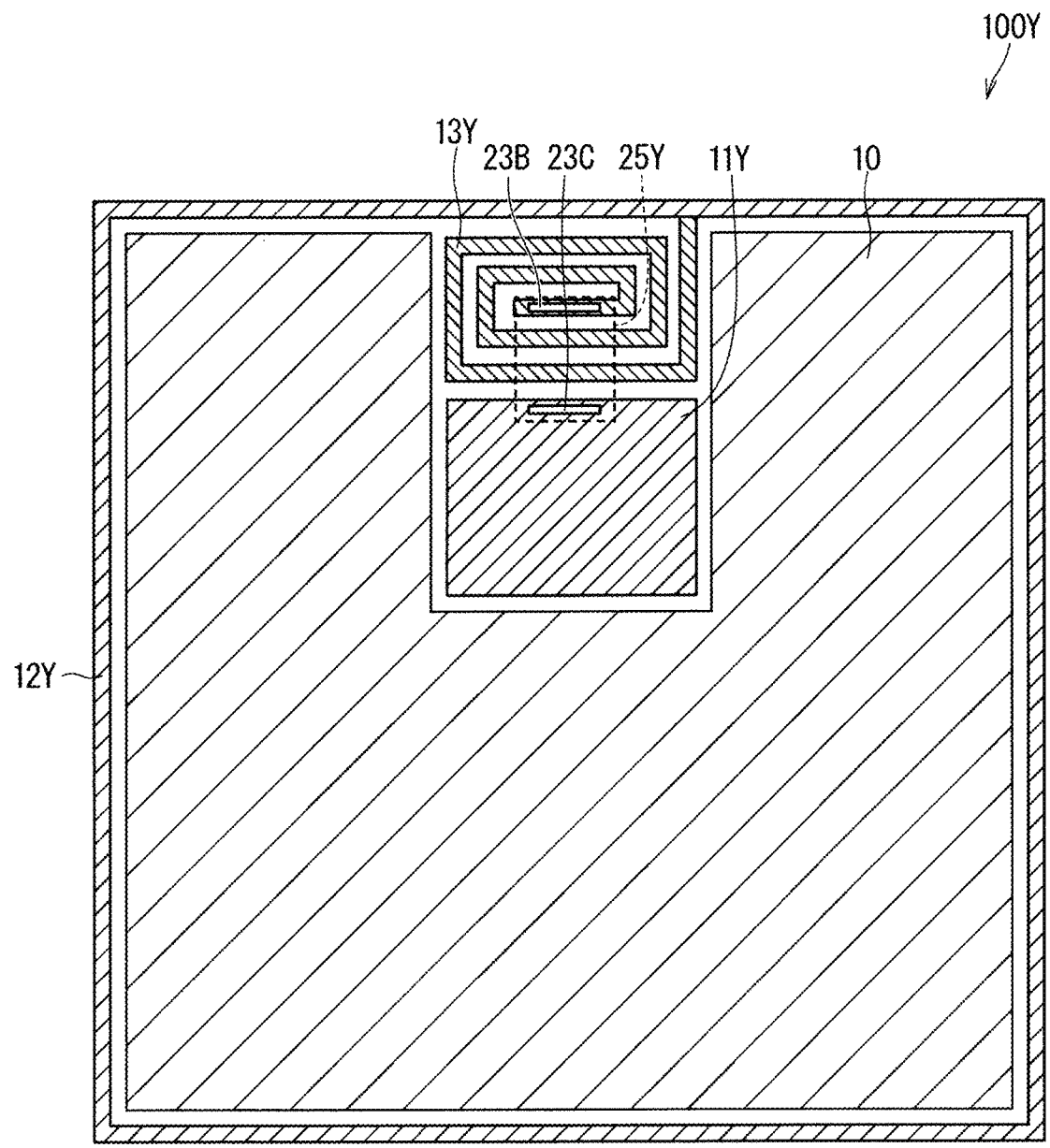
FIG. 11 is a plan view schematically showing another modification of the configuration of a silicon carbide MOSFET according to the embodiment.

FIG. 11 is a plan view schematically showing another modification of the configuration of a silicon carbide MOSFET 100Y according to the first embodiment.

In the silicon carbide MOSFET 100Y illustrated in FIG. 11, instead of making a spiral gate line 13Y surround a gate pad 11Y or the active region, the spiral gate line 13Y contacts one end of a buried gate resistance 25Y through the gate contact hole 23B from a center part (one end) of the spiral gate line 13Y. The other end of the buried gate resistance 25Y contacts a wide-area gate line 12Y through a different gate contact hole 23C outside the spiral gate line 13Y.

While the spiral gate line 13Y is wound, turns of the wound spiral gate line 13Y do not contact each other. Namely, the spiral gate line 13Y is not formed into a closed ring-like shape (closed curve).

Even in the foregoing planar layout, it is still possible to form a buried gate inductance resulting from a spiral coil between the gate pad 11Y and the gate electrode 7b in the active region, making it possible to achieve effect comparable to that achieved by the first embodiment.

According to the illustration shown in FIG. 11, the spiral gate line 13Y contacts the buried gate resistance 25Y through the gate contact hole 23B from the center part of the spiral gate line 13Y. In an alternative configuration, the spiral gate line 13Y may contact a different conductor layer through a contact hole instead of contacting the buried gate resistance 25Y.

Second Embodiment

A semiconductor device and a method of manufacturing the semiconductor device according to a second embodiment will be described below. In the following description, a constituting element similar to that described above in the foregoing embodiment will be given the same sign in the drawings, and the detailed description of this element will be omitted, if appropriately.

<Configuration of Semiconductor Device>

Figure 17:
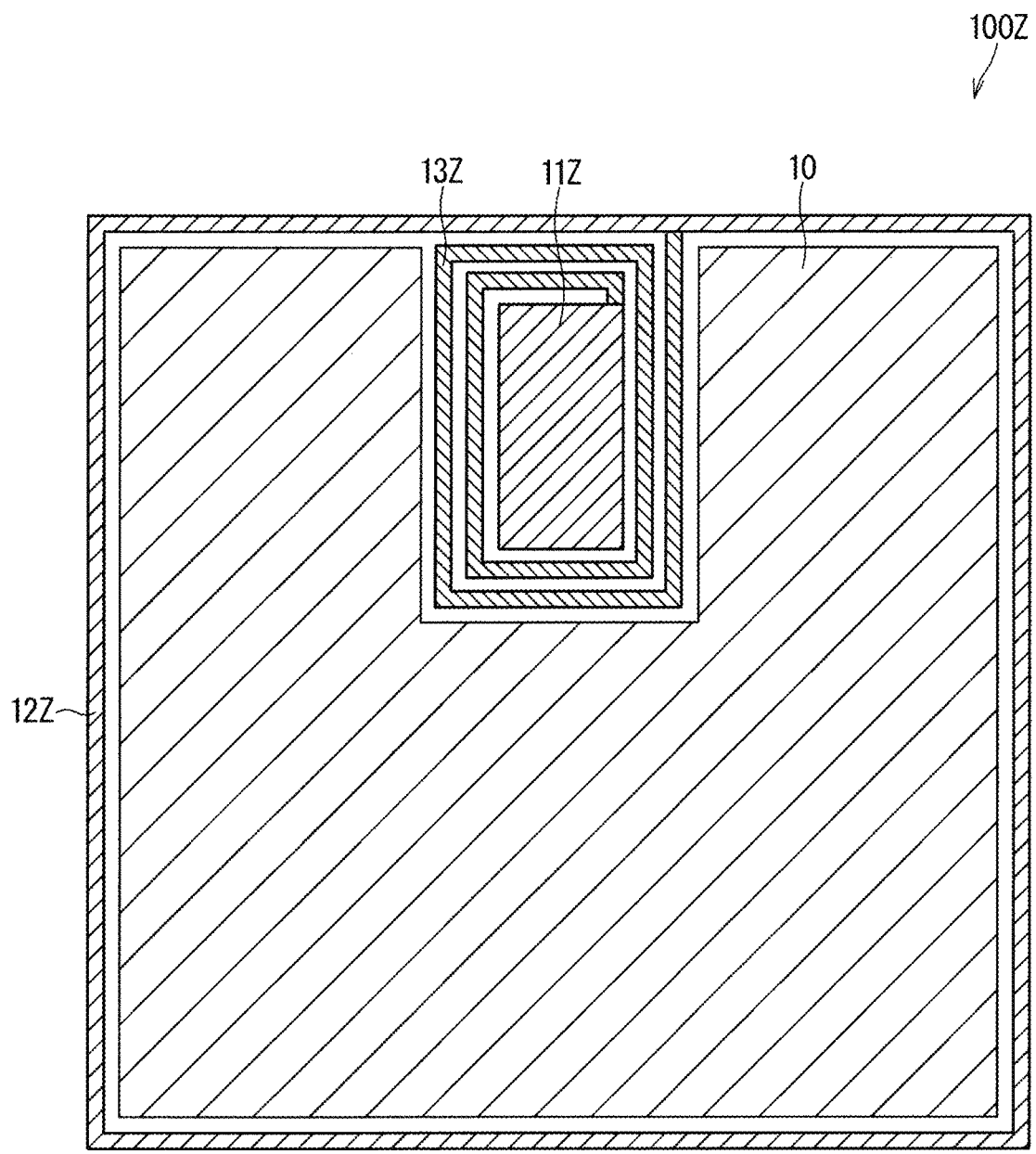
FIG. 17 is a plan view schematically showing an example of the configuration of a silicon carbide MOSFET according to the embodiment.

FIG. 17 is a plan view schematically showing an example of the configuration of a silicon carbide MOSFET 100Z according to the second embodiment. Unlike the example shown in the first embodiment, the buried gate resistance 25 is omitted, a gate pad 11Z and a spiral gate line 13Z directly contact each other, and a wide-area gate line 12Z and the spiral gate line 13Z directly contact each other.

<Method of Manufacturing Semiconductor Device>

A method of manufacturing a silicon carbide semiconductor device according to the second embodiment is principally the same as the manufacturing method described in the first embodiment, while a mask pattern is changed appropriately in order to avoid formation of the buried gate resistance 25, so that the detailed description thereof will be omitted.

In the equivalent circuit model illustrated in FIG. 12, the buried gate resistance 25 becomes 0Ω to allow switching operation at a higher speed. This makes it possible to realize a semiconductor device with low switching loss.

On the other hand, a gain in a high-frequency region is increased compared to the case using the buried gate resistance 25. On the other hand, a gain relative to high-frequency oscillation can be reduced by adjusting the value of the buried gate inductance 280 appropriately, making it possible to suppress gate oscillation.

Furthermore, a region for the buried gate resistance 25 becomes unnecessary in the planar layout of the silicon carbide MOSFET 100 shown in FIG. 1 to further achieve chip size reduction.

An inductance may be applied to the gate terminal 301 of any of the silicon carbide MOSFETs described in the foregoing embodiments by a method of forming a gate line (gate wire) into an elongated shape.

In this regard, the inductance of a coil is generally proportional to the square of the number of turns. Hence, while increasing the number of windings is desired for forming a large inductance, it is not realistic to increase the number of windings using a gate wire not covered with a nonconductor.

For this reason, for forming a large inductance using a gate wire, the gate wire is required to be formed into an elongated shape. This may require consideration to the risk of disconnection due to vibration or heat generation, or may require a large module size.

In this regard, by forming an inductance resulting from a line having a spiral shape inside a chip, it becomes possible to realize a compact module having high reliability.

A spiral gate line having a shape determined by photolithography has better shape reproducibility than a gate wire formed by mechanical action. This further produces an advantage of providing good reproducibility of an inductance level.

Third Embodiment

A power converter and a method of manufacturing the power converter according to a third embodiment will be described. In the following description, a constituting element similar to that described above in the foregoing embodiments will be given the same sign in the drawings, and the detailed description of this element will be omitted, if appropriately.

<Configuration of Power Converter>

In the third embodiment, the semiconductor device according to the embodiment described above is applied to the power converter. While the power converter to which the semiconductor device is applied is not limited to a converter for a particular purpose, the semiconductor device is applied to a three-phase inverter in a case described below.

FIG. 18 conceptually shows an example of the configuration of a power conversion system including the power converter according to the third embodiment.

As illustrated in FIG. 18, the power conversion system includes a power source 2100, a power converter 2200, and a load 2300. The power source 2100 is a DC power source and supplies DC power to the power converter 2200. Various types of power sources are applicable to the power source 2100. For example, the power source 2100 can be configured using a DC system, a solar cell, or a battery cell, for example. The power source 2100 can also be configured using a rectifier circuit connected to an AC system or an AC-DC converter, for example. The power source 2100 can also be configured using a DC-DC converter for converting DC power output from a DC system to predetermined power.

The power converter 2200 is a three-phase inverter connected between the power source 2100 and the load 2300. The power converter 2200 converts DC power supplied from the power source 2100 to AC power, and supplies the resultant AC power to the load 2300.

As illustrated in FIG. 18, the power converter 2200 includes a conversion circuit 2201 that converts DC power to AC power and outputs the resultant AC power, a driving circuit 2202 that outputs a driving signal for driving each switching element in the conversion circuit 2201, and a control circuit 2203 that outputs a control signal for controlling the driving circuit 2202 to the driving circuit 2202.

The load 2300 is a three-phase motor to be driven by AC power supplied from the power converter 2200. The load 2300 is a motor not limited to a particular purpose but to be mounted on various types of electric equipment. For example, the load 2300 is used as a motor for a hybrid vehicle, an electric car, a railway car, an elevator, or an air conditioner, for example.

The power converter 2200 will be described in detail below. The conversion circuit 2201 includes a switching element and a free-wheeling diode (not shown in the drawings). In response to switching operation by the switching element, DC power supplied from the power source 2100 is converted to AC power, and the resultant AC power is supplied to the load 2300.

While the conversion circuit 2201 may be configured into various types of circuit configurations, the conversion circuit 2201 according to the third embodiment is a two-level three-phase full-bridge circuit, and includes six switching elements and six free-wheeling diodes connected in inverse-parallel to corresponding ones of the switching elements.

The semiconductor device according to any of the embodiments described above is applied to at least one of each switching element and a corresponding free-wheeling diode in the conversion circuit 2201. The six switching elements are connected in series in units of two switching elements to form upper and lower arms, and each of the upper and lower arms forms respective phases (specifically, a U phase, a V phase, and W phase) of the full-bridge circuit. Output terminals of each of the upper and lower arms (specifically, three output terminals of the conversion circuit 2201) are connected to the load 2300.

The driving circuit 2202 generates a driving signal for driving the switching element in the conversion circuit 2201, and supplies the generated driving signal to a control electrode of the switching element in the conversion circuit 2201. More specifically, on the basis of a control signal output from the control circuit 2203 described later, the driving circuit 2202 outputs a driving signal for bringing the switching element to an ON state and a driving signal for bringing the switching element to an OFF state to the control electrode of each switching element.

The driving signal for maintaining the switching element in the ON state is a voltage signal of equal to or greater than a threshold voltage of the switching element (namely, an ON signal). The driving signal for maintaining the switching element in the OFF state is a voltage signal of equal to or less than the threshold voltage of the switching element (namely, an OFF signal)

The control circuit 2203 controls the switching element in the conversion circuit 2201 so as to supply intended power to the load 2300. More specifically, on the basis of power to be supplied to the load 2300, time is calculated in which each of the switching elements in the conversion circuit 2201 is to be in the ON state (namely, ON time). For example, the conversion circuit 2201 can be controlled by PWM control by which the ON time of the switching element is modulated in response to a voltage to be output.

The control circuit 2203 outputs a control command (namely, a control signal) to the driving circuit 2202 so as to output the ON signal to the switching element to be brought to the ON state at an intended point in time and to output the OFF signal to the switching element to be brought to the OFF state at an intended point in time. On the basis of the output control signal, the driving circuit 2202 outputs the ON signal or the OFF signal as the driving signal to the control electrode of each switching element.

In the power converter 2200 according to the third embodiment, the semiconductor device according to any of the embodiments described above is applied as the switching element in the conversion circuit 2201. This achieves stabilization of an ON resistance after passage of a current-carrying cycle.

In the example described in the third embodiment, the semiconductor device according to any of the embodiments described above is applied to the two-level three-phase inverter. However, this is not the only example of the application but the semiconductor device according to any of the embodiments described above is applicable to various power converters.

While the two-level power converter is described in the third embodiment, the semiconductor device according to any of the embodiments described above is also applicable to a three-level or multi-level power converter. For supply of power to a single-phase load, the semiconductor device according to any of the embodiments described above may be applied to a single-phase inverter.

For supply of power to a DC load, for example, the semiconductor device according to any of the embodiments described above is applicable to a DC-DC converter or an AC-DC converter.

The power converter to which the semiconductor device according to any of the embodiments described above is applied is not limited to a power converter using the foregoing motor as a load but is also usable as a power source device of a discharge machine, a laser machine, an induction heating cooking utensil, or a non-contact charging system, for example. The power converter to which the semiconductor device according to any of the embodiments described above is applied is also usable as a power conditioner in a solar generation system or a power storage system, for example.

The semiconductor switching element used in the embodiments described above is not limited to a switching element made of silicon (Si) semiconductor. For example, the semiconductor switching element may be made of a non-Si semiconductor material having a wider bandgap than Si semiconductor.

The wide bandgap semiconductor as the non-Si semiconductor material may be silicon carbide, a gallium nitride based material, or diamond, for example.

The switching element made of the wide bandgap semiconductor is still usable in a high-voltage region in which it is difficult for Si semiconductor to perform unipolar operation, thereby achieving significant reduction in switching loss to be caused during switching operation. This allows significant reduction in power loss.

The switching element made of the wide bandgap semiconductor results in small power loss and has high heat resistance. Thus, in forming a power module with a cooling unit, a heat dissipation fin of a heat sink can be reduced in size to allow further size reduction of a semiconductor module.

The switching element made of the wide bandgap semiconductor is suitable for high-frequency switching operation. For this reason, if this switching element is applied to a converter circuit in great need of higher frequency, a switching frequency can be increased to allow size reduction of a reactor or a capacitor connected to the converter circuit.

As a result, even if the semiconductor switching element according to the embodiments described above is a switching element made of wide gap semiconductor such as silicon carbide, this switching element still achieves comparable effect.

Effects Achieved by Embodiments Described Above

While the MOSFET is shown as the semiconductor switching element according to the embodiments described above, the semiconductor switching element may alternatively be an insulated gate bipolar transistor (namely, an IGBT).

If the semiconductor switching element is an IGBT, the configuration according to each of the embodiments can be applied in the same way by replacing the drain and the source as main electrodes with a collector and an emitter respectively.

If the semiconductor switching element is a bipolar transistor, the configuration according to each of the embodiments can be applied in the same way by replacing the gate as a control electrode with a base.

In the embodiments described above, silicon carbide is used as a semiconductor material. The reason for this lies in a background that, as an SiC-MOSFET is generally required to be driven at a higher speed than an Si-IGBT, the problem of the gate oscillation becomes more notable. However, applying the technique described in the embodiments to an Si-IGBT or an Si-MOSFET still makes it possible to achieve comparable effect. A trench structure may be employed in the SiC-MOSFET, etc.

In the embodiments described above, the example of the configuration of the power semiconductor module is shown. Regarding a semiconductor module for a different purpose, as long as this semiconductor module has a configuration in which a plurality of semiconductor switching elements is connected in parallel and is to operate in parallel, the gate oscillation can still be alleviated or suppressed by applying a configuration conforming to that of each of the embodiments in the same way.

While the exemplary application shown in the embodiments described above is application to the semiconductor module, comparable effect can still be achieved in a system in which silicon carbide MOSFETs are introduced in individual packages and are used in parallel.

It is noted that the embodiments described above should be considered to be illustrative and not restrictive in all aspects. The technical scope of the present invention is shown by the claims, not by the statements of the embodiments described above, and all changes are intended to be covered within a meaning and within a range equivalent to those of the claims.

Exemplary effects achieved by the embodiments described above will be shown next. While these effects will be shown on the basis of the exemplary specific structures in the embodiments described above, these structures may be replaced with other exemplary specific structures shown in the present description within a range in which comparable effects are achieved.

This replacement may be made across a plurality of embodiments. Namely, exemplary structures shown in different embodiments may be combined (including a combination not referred to explicitly in the foregoing embodiments) for achieving comparable effects.

According to the embodiments described above, the semiconductor device includes a first gate electrode in an active region, the gate pad 11 (or gate pad 11Y, gate pad 11Z) in a first region different from the active region in a plan view, and a first gate line. The first gate electrode corresponds to the gate electrode 7b, for example. The first gate line corresponds to any one of the spiral gate line 13, the spiral gate line 13Y, and the spiral gate line 13Z, for example. The spiral gate line 13 electrically connects the gate electrode 7b and the gate pad 11 to each other. The spiral gate line 13 is formed into a spiral shape. The spiral gate line 13 is made of a different type of material from the gate electrode 7b.

In this configuration, a tradeoff between improvement in switching speed and reduction in gain relative to high-frequency oscillation is alleviated using an inductance component resulting from the spiral gate line. This makes it possible to reduce gate oscillation while suppressing reduction in switching speed. The spiral gate line is made of a material having a relatively low sheet resistance of a different type from the gate electrode 7b. This reduces a resultant gate resistance to cause no hindrance to high-speed switching operation.

Even if at least one of the other exemplary structures shown in the present description is added appropriately to the structure described above, namely, even if another exemplary structure shown in the present description and not referred to as the structure described above is added appropriately, comparable effect can still be achieved.

According to the embodiments described above, the semiconductor device includes the gate electrode 7b in an active region, the gate pad 11 in a first region different from the active region in a plan view, and the spiral gate line 13. The spiral gate line 13 electrically connects the gate electrode 7b and the gate pad 11 to each other. The spiral gate line 13 is formed into a spiral shape. The spiral gate line 13 is arranged in the first region.

In this configuration, a tradeoff between improvement in switching speed and reduction in gain relative to high-frequency oscillation is alleviated using an inductance component resulting from the spiral gate line. This makes it possible to reduce gate oscillation while suppressing reduction in switching speed. Furthermore, arranging the spiral gate line in the first region different from the active region achieves reduction in non-uniformity of inductance components formed between the gate pad and the gate electrode, making it possible to maintain uniformity of switching operation.

According to the embodiments described above, the spiral gate line 13 surrounds the gate pad 11 in a plan view. This configuration makes it possible to reduce gate oscillation while suppressing reduction in switching speed using an inductance component resulting from the spiral gate line.

According to the embodiments described above, the semiconductor device includes the gate electrode 7b in an active region, the gate pad 11X in a first region different from the active region in a plan view, and a first gate line. The first gate line corresponds to the annular gate line 13X, for example. The annular gate line 13X electrically connects the gate electrode 7b and the gate pad 11X to each other. The annular gate line 13X surrounds the active region in a plan view and is not closed.

In this configuration, a buried gate inductance resulting from a spiral coil can be formed between the gate pad 11X and the gate electrode 7b in the active region to alleviate a tradeoff between improvement in switching speed and reduction in gain relative to high-frequency oscillation. This makes it possible to reduce gate oscillation while suppressing reduction in switching speed.

According to the embodiments described above, the annular gate line 13X is made of a different type of material from the gate electrode 7b. In this configuration, the spiral gate line is made of a material having a relatively low sheet resistance of a different type from the gate electrode 7b. This reduces a resultant gate resistance to cause no hindrance to high-speed switching operation.

According to the embodiments described above, the annular gate line 13X is arranged in the first region. In this configuration, arranging the spiral gate line in the first region different from the active region achieves reduction in non-uniformity of inductance components formed between the gate pad and the gate electrode, making it possible to maintain uniformity of switching operation.

According to the embodiments described above, the semiconductor device includes the source electrode 10. The source electrode 10 covers the gate electrode 7b across a first insulating film in the active region. The first insulating film corresponds to the interlayer insulating film 15, for example. The annular gate line 13X surrounds the source electrode 10 in a plan view. In this configuration, a buried gate inductance resulting from a spiral coil can be formed between the gate pad 11X and the gate electrode 7b in the active region to alleviate a tradeoff between improvement in switching speed and reduction in gain relative to high-frequency oscillation. This makes it possible to reduce gate oscillation while suppressing reduction in switching speed.

According to the embodiments described above, the spiral gate line 13 is made of metal. In this configuration, the spiral gate line is made of metal having a relatively low sheet resistance different from a material of the gate electrode 7b. This reduces a resultant gate resistance to cause no hindrance to high-speed switching operation.

According to the embodiments described above, the semiconductor device includes a second gate electrode in the first region, and a second gate line in the first region. The second gate electrode corresponds to the gate electrode 7a, for example. The second gate line corresponds to any one of the wide-area gate line 12, the wide-area gate line 12X, the wide-area gate line 12Y, and the wide-area gate line 12Z, for example. The gate electrode 7a is connected to the gate electrode 7b. The wide-area gate line 12 is connected to the gate electrode 7a. In this configuration, the wide-area gate line 12 electrically connected to the gate electrode 7b can be arranged in the first region different from the active region.

According to the embodiments described above, the spiral gate line 13Z is directly connected to the gate pad 11Z and the wide-area gate line 12Z. In this configuration, the spiral gate line 13Z is connected to the gate pad 11Z and the wide-area gate line 12Z electrically connected to the gate electrode 7b in the first region different from the active region to achieve reduction in non-uniformity of inductance components formed between the gate pad 11Z and the gate electrode 7b. This makes it possible to maintain uniformity of switching operation.

According to the embodiments described above, the semiconductor device includes a second insulating film in the first region. The second insulating film corresponds to the interlayer insulating film 15, for example. The interlayer insulating film 15 covers the gate electrode 7a and has a plurality of contact holes. The contact hole corresponds to any one of the gate contact hole 23A and the gate contact hole 23B, for example. This configuration allows the spiral gate line 13 and the wide-area gate line 12 to be connected to each other through the contact hole.

According to the embodiments described above, the spiral gate line 13 is connected to the gate electrode 7a through the gate contact hole 23B. The wide-area gate line 12 is connected to the gate electrode 7a through the gate contact hole 23A. This configuration allows the spiral gate line 13 and the wide-area gate line 12 to be electrically connected to each other through the buried gate resistance 25.

According to the embodiments described above, the power converter includes a plurality of any of the semiconductor devices described above. The semiconductor device corresponds to any one of the silicon carbide MOSFET 100, the silicon carbide MOSFET 100X, the silicon carbide MOSFET 100Y, and the silicon carbide MOSFET 100Z. The silicon carbide MOSFETs 100 are connected in parallel to each other.

In this configuration, in the power converter in which a plurality of semiconductor devices (more specifically, semiconductor switching elements) is connected in parallel and is to operate in parallel, an inductance component is applied to the gate line of each of the semiconductor switching elements. The inductance component behaves like a high impedance relative to gate oscillation, so that the gate oscillation can be alleviated or suppressed. On the other hand, the inductance component behaves like a low impedance relative to switching operation at a frequency lower than a gate oscillation frequency to cause substantially no increase in power loss. This makes it possible to alleviate or suppress the gate oscillation while causing no increase in power loss at a plurality of the semiconductor switching elements connected in parallel and to operate in parallel.

EXPLANATION OF REFERENCE SIGNS

1 Sic Substrate
2 Drift layer
3 Well region
4 Source region
5 Contact region
6 Gate insulating film
7a, 7b Gate electrode
8 Outer peripheral contact region
9 Outer peripheral well region
10 Source electrode
11, 11X, 11Y, 11Z Gate pad
12, 12X, 12Y, 12Z Wide-area gate line
13, 13Y, 13Z Spiral gate line
13X Annular gate line
14 Field insulating film
15 Interlayer insulating film
16 Guard ring region
18 Outer peripheral well contact film
19 Source contact film
20 Drain electrode
21 Well contact hole
22 Source contact hole
23A, 23B, 23C Gate contact hole
25, 25X, 25Y Buried gate resistance
26 Eternal gate resistor
100, 100X, 100Y, 100Z Silicon carbide MOSFET
101 Power semiconductor module
207 Internal resistance
210 Source parasitic inductance
211 Gate parasitic inductance
220 Drain parasitic inductance
251 Gate-source capacitance
252 Gate-drain capacitance
253 Source-drain capacitance
258 Input capacitance
260 Channel conductance
280 Buried gate inductance
301 Gate terminal
2100 Power source
2200 Power converter
2201 Conversion circuit
2202 Driving circuit
2203 Control circuit
2300 Load

The invention claimed is:

1. A power converter comprising:
a plurality of semiconductor devices,
each of the semiconductor devices includes
a first gate electrode in an active region;
a gate pad in a first region different from the active region in a plan view; and
a first gate line electrically connecting the first gate electrode and the gate pad to each other, wherein
the first gate line is formed into a spiral shape,
an entirety of the first gate line is made of a different type of material than the first gate electrode, and the different type of material has a lower resistance than a material of the first gate electrode, and
the plurality of semiconductor devices are connected in parallel to each other.

2. The power converter according to claim 1, wherein the first gate line surrounds the gate pad in a plan view.

3. The power converter according to claim 1, wherein the first gate line is made of metal.

4. The power converter according to claim 1, further comprising:
a second gate electrode in the first region connected to the first gate electrode; and
a second gate line in the first region connected to the second gate electrode.

5. The power converter according to claim 4, wherein the first gate line is directly connected to the gate pad and the second gate line.

6. The power converter according to claim 4, further comprising:
a second insulating film in the first region, the second insulating film covering the second gate electrode and having a plurality of contact holes.

7. The power converter according to claim 6, wherein each of the first gate line and the second gate line is connected to the second gate electrode through any of the contact holes.

8. A power converter comprising:
a plurality of semiconductor devices,
each of the semiconductor devices includes
a first gate electrode in an active region;
a gate pad in a first region different from the active region in a plan view; and
a first gate line electrically connecting the first gate electrode and the gate pad to each other, wherein
the first gate line is formed into a spiral shape,
the first gate line is arranged in the first region,
an entirety of the first gate line is made of a different type of material than the first gate electrode, and the different type of material has a lower resistance than a material of the first gate electrode, and
the plurality of semiconductor devices are connected in parallel to each other.

9. The power converter according to claim 8, wherein the first gate line surrounds the gate pad in a plan view.

10. The power converter according to claim 8, wherein the first gate line is made of metal.

11. The power converter according to claim 8, further comprising:
a second gate electrode in the first region connected to the first gate electrode; and
a second gate line in the first region connected to the second gate electrode.

12. A power converter comprising:
a plurality of semiconductor devices,
each of the semiconductor devices includes
a first gate electrode in an active region;
a gate pad in a first region different from the active region in a plan view; and
a first gate line electrically connecting the first gate electrode and the gate pad to each other, wherein
the first gate line surrounds the active region in a plan view and is not closed,
an entirety of the first gate line is made of a different type of material than the first gate electrode, and the different type of material has a lower resistance than a material of the first gate electrode, and
the plurality of semiconductor devices are connected in parallel to each other.

13. The power converter according to claim 12, wherein the first gate line is arranged in the first region.

14. The power converter according to claim 12, further comprising:
a source electrode covering the first gate electrode across a first insulating film in the active region, wherein
the first gate line surrounds the source electrode in a plan view.

15. The power converter according to claim 12, wherein the first gate line is made of metal.

16. The power converter according to claim 12, further comprising:
a second gate electrode in the first region connected to the first gate electrode; and
a second gate line in the first region connected to the second gate electrode.

* * * * *